(12) United States Patent
Sasaki et al.

(10) Patent No.: US 12,464,710 B2
(45) Date of Patent: Nov. 4, 2025

(54) SEMICONDUCTOR MEMORY DEVICE HAVING THE STRUCTURE OF WORD-LINES TO AVOID SHORT CIRCUIT AND METHOD OF MANUFACTURING THE SAME

(71) Applicant: MICRON TECHNOLOGY, INC., Boise, ID (US)

(72) Inventors: Takashi Sasaki, Higashihiroshima (JP); Junya Suzuki, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 357 days.

(21) Appl. No.: 17/486,611

(22) Filed: Sep. 27, 2021

(65) Prior Publication Data
US 2023/0096256 A1 Mar. 30, 2023

(51) Int. Cl.
*H10B 12/00* (2023.01)

(52) U.S. Cl.
CPC .......... *H10B 12/488* (2023.02); *H10B 12/50* (2023.02)

(58) Field of Classification Search
CPC ...... H10B 12/488; H10B 12/50; H10B 12/30; H10B 12/34; H10B 12/48; H10B 12/053; H10B 12/09; G11C 8/14
See application file for complete search history.

(56) References Cited

U.S. PATENT DOCUMENTS

| | | | | |
|---|---|---|---|---|
| 6,495,870 B1* | 12/2002 | Sekiguchi | ................ | G03F 1/36 |
| | | | | 257/E27.081 |
| 2003/0062550 A1* | 4/2003 | Sekiguchi | ................ | G03F 1/36 |
| | | | | 257/E27.081 |
| 2009/0040824 A1* | 2/2009 | Iizuka | ................... | H10B 69/00 |
| | | | | 365/210.1 |
| 2019/0206877 A1* | 7/2019 | Kim | ...................... | H10B 63/30 |

* cited by examiner

*Primary Examiner* — Jay C Kim
*Assistant Examiner* — John Lin
(74) *Attorney, Agent, or Firm* — Dorsey & Whitney LLP

(57) ABSTRACT

An apparatus includes a substrate, a memory cell region provided over the substrate, a peripheral region provided over the substrate and adjacent to the memory cell region, and first, second, third, fourth and fifth word-lines each extending in parallel across the memory cell region and the peripheral region in numerical order. An offcut of the second word-line is interposed between edge portions of the first and third word-lines, and no offcut of the fourth word-line is interposed between edge portions of the third and fifth word-lines.

20 Claims, 35 Drawing Sheets

SEMICONDUCTOR MEMORY DEVICE HAVING THE STRUCTURE OF WORD-LINES TO AVOID SHORT CIRCUIT AND METHOD OF MANUFACTURING THE SAME

BACKGROUND

For a semiconductor memory device, finer geometries are being developed to increase the data storage capacity of a semiconductor memory device such as dynamic random access memory (DRAM). For example, the size of a repeating pitch of wiring such as word-lines of a DRAM is reduced, and the distance between the word-lines is also reduced. However, if misalignment of a word-line occurs when a contact electrode to be connected to the word-line is formed, the contact electrode may become open or may become shorted to an adjacent word-line.

BRIEF DESCRIPTION OF THE DRAWINGS

FIGS. 2A to 20A are plan views illustrating the examples of the schematic configurations in the respective exemplary processing stages;

FIGS. 3B to 10B are vertical cross-sectional views illustrating the schematic configurations in sections taken along lines E-E in FIGS. 3A to 10A, respectively;

FIGS. 11B to 20B are vertical cross-sectional views illustrating the schematic configurations in sections taken along lines F-F in FIGS. 11A to 20A, respectively;

FIGS. 11C to 20C are vertical cross-sectional views illustrating the schematic configurations in sections taken along lines G-G in FIGS. 11A to 20A, respectively;

FIGS. 11D to 20D are vertical cross-sectional views illustrating the schematic configurations in sections taken along lines H-H in FIGS. 11A to 20A, respectively;

FIGS. 11E to 20E are vertical cross-sectional views illustrating the schematic configurations in sections taken along lines I-I in FIGS. 11A to 20A, respectively;

FIGS. 11F to 20F are vertical cross-sectional views illustrating the schematic configurations in sections taken along lines J-J in FIGS. 11A to 20A, respectively;

DETAILED DESCRIPTION

Figure 1A:
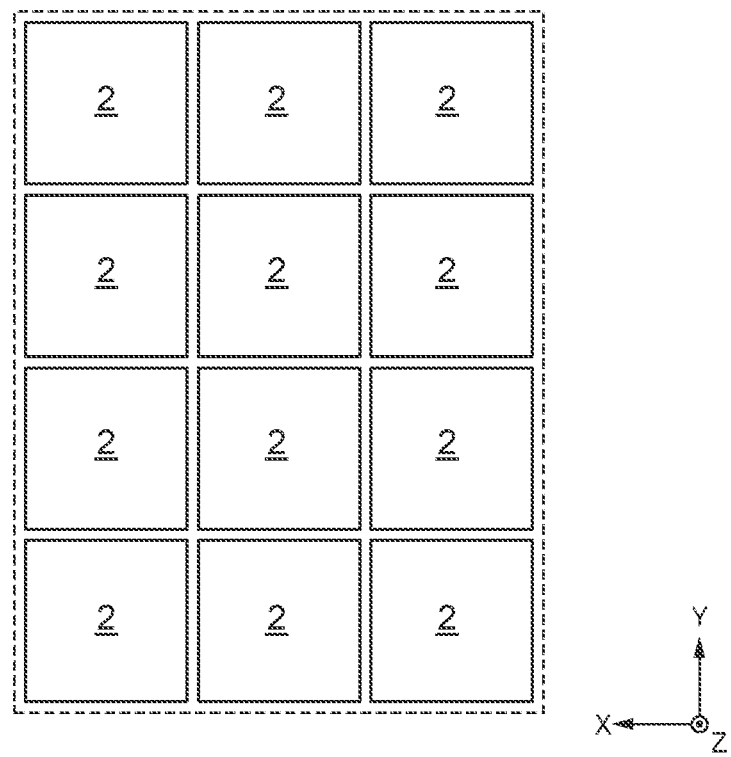
FIG. 1A is a plan view illustrating a schematic configuration of part of a memory cell region of a semiconductor memory device according to an embodiment of the present disclosure.

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor memory device 1 and a method of manufacturing it according to an embodiment will now be described with reference to the drawings. The semiconductor memory device 1 exemplified by a DRAM will be described. In description of the embodiment, common or related elements, or substantially like elements are designated by like signs, and description thereof is omitted. In the drawings, the dimensions and proportion of each component in the respective drawings do not necessarily match the dimensions and proportion thereof in the embodiment. The dimensions and proportion of each component do not necessarily match between each plan view and the corresponding vertical cross-sectional view. Lines E-E, lines F-F, lines G-G, lines H-H, lines I-I, and lines J-J merely indicate schematic positions in the corresponding vertical cross-sectional views, and do not necessarily match positions in the respective vertical cross-sectional views. The up-and-down direction in the following description means an up-and-down direction when a semiconductor substrate 10 is positioned on a lower side.

Figure 1B:
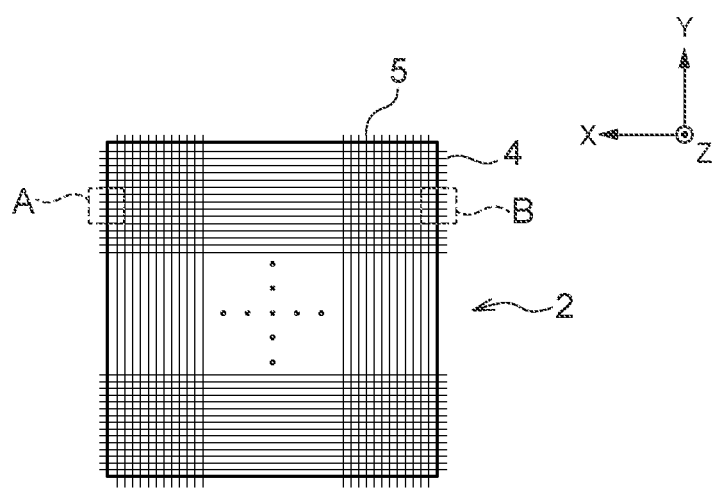
FIG. 1B is a plan view illustrating a schematic configuration of a memory mat.

FIG. 1A and FIG. 1B are diagrams illustrating a planar layout of the semiconductor memory device according to the embodiment. As illustrated in FIG. 1A, the semiconductor memory device 1 includes a plurality of memory mats 2 that are arranged on a surface of a semiconductor substrate in the form of a matrix. As illustrated in FIG. 1B, in each memory mat 2, a plurality of word-lines 4 are arranged in parallel so as to extend in the X direction in the drawings. In the memory mat 2, a plurality of bit-lines 5 are arranged in parallel so as to be orthogonal to the word-lines 4, that is, so as to extend in the Y direction in the drawings. A direction parallel to the word-lines 4, that is, the X direction is called "word-line direction". A direction parallel to the bit-lines 5, that is, the Y direction is called "bit-line direction".

In peripheral portions of the memory mat 2 in the word-line direction, memory-mat end regions A and B are arranged. The memory-mat end region A is positioned in one end portion of the memory mat 2 in the X direction, and the memory-mat end region B is positioned in the other end portion of the memory mat 2 in the X direction. The respective word-lines 4 are connected to a row decoder (not illustrated) at their peripheral portions. At the time of reading from or writing to a memory cell, a selected row address is input to the row decoder from a row address buffer (not illustrated). The word-lines 4 are coupled to corresponding ones of a plurality of memory cells to control accesses to the corresponding ones of the memory cells.

The respective bit-lines 5 are connected to a column decoder (not illustrated) at their peripheral portions. At the time of reading from or writing to a memory cell, a selected column address is input to the column decoder from a column address buffer (not illustrated). The bit-lines 5 are coupled to corresponding ones of the memory cells to control accesses to the corresponding ones of the memory cells.

Figure 2A:
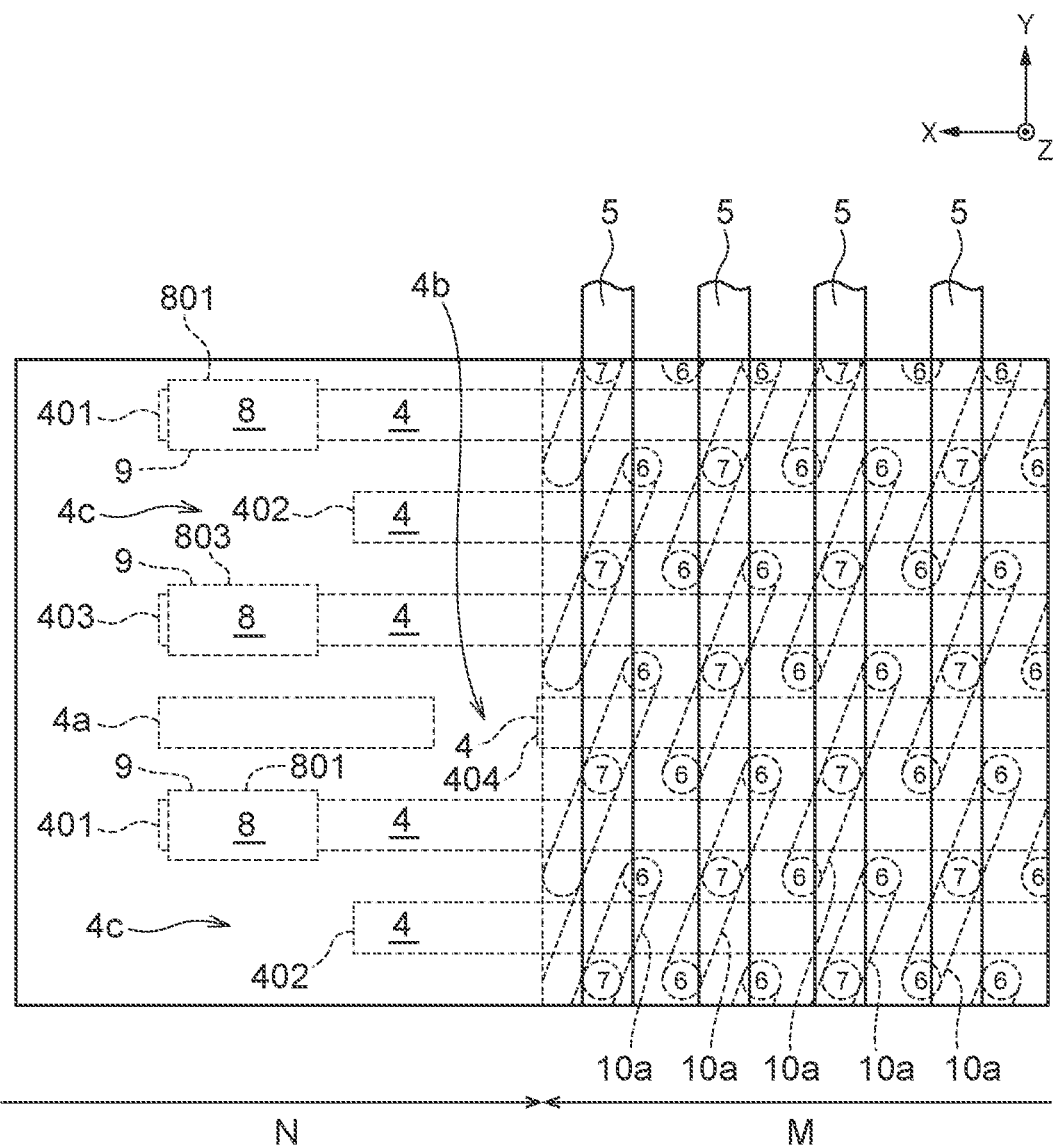
FIG. 2A is a plan layout view illustrating a schematic configuration of the memory cell region of the semiconductor memory device according to the embodiment, in which a memory-mat end region A in FIG. 1B is illustrated in an enlarged manner.
Figure 2B:
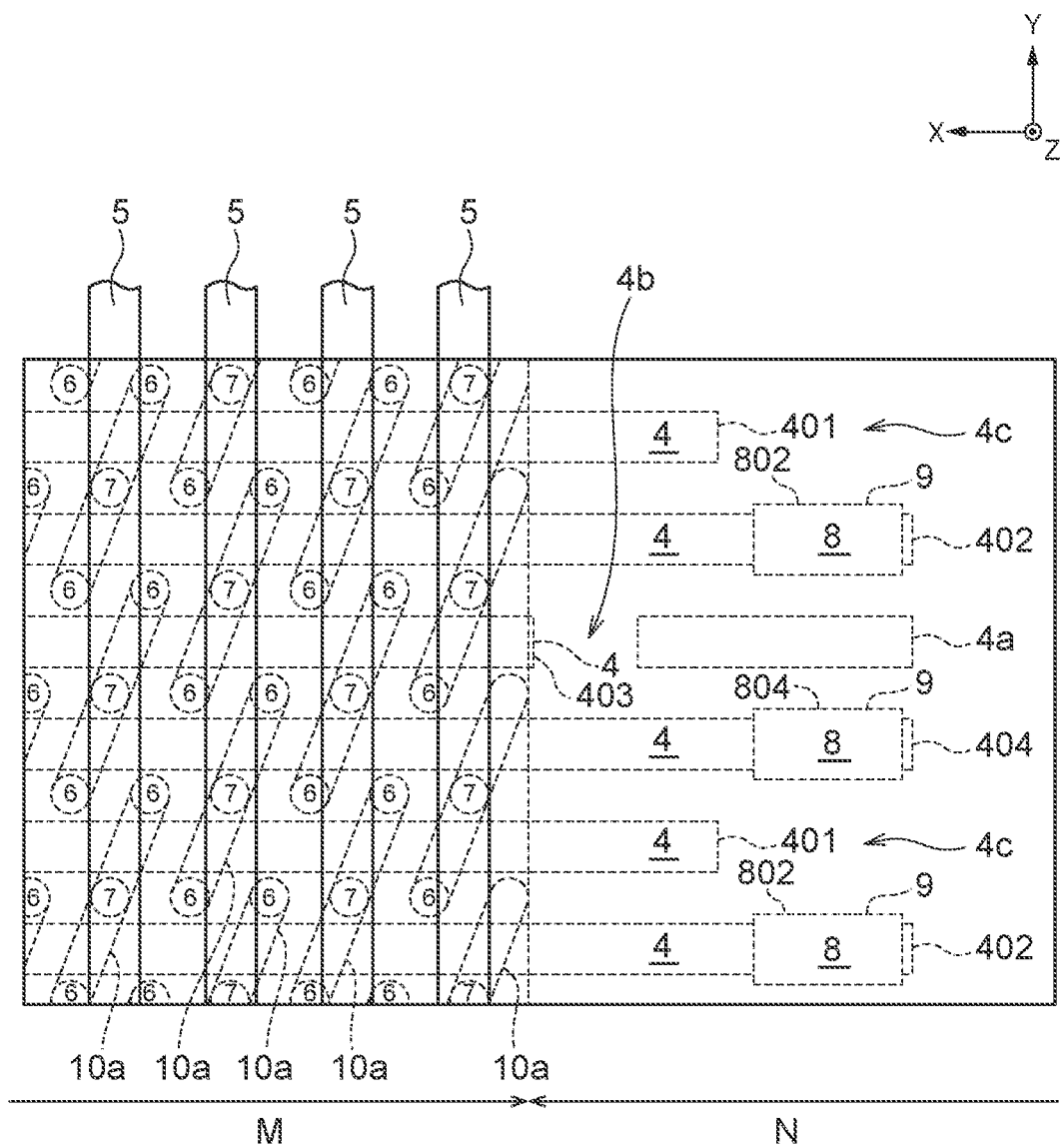
FIG. 2B is a plan layout view illustrating a schematic configuration of the memory cell region of the semiconductor memory device according to the embodiment, in which a memory-mat end region B in FIG. 1B is illustrated in an enlarged manner.

FIG. 2A is a plan view illustrating a schematic configuration in the memory-mat end region A in FIG. 1B. The layout illustrated in FIG. 2B is the same in configuration as the layout illustrated in FIG. 2A except that they are disposed in a symmetrical manner The planar structure in FIG. 2B is a structure obtained by flipping the planar structure in FIG. 2A. Because the configurations in the memory-mat end region A and the memory-mat end region B, that is, configurations in FIG. 2A and FIG. 2B are substantially the same including cross-sectional structures thereof, the following describes FIG. 2A.

As illustrated in FIG. 2A, in the memory-mat end region A, the semiconductor memory device 1 includes a memory cell array region M and a peripheral region N. In the memory cell array region M, a plurality of word-lines 4 arranged at regular pitches in the Y direction and a plurality of bit-lines 5 arranged at regular pitches in the X direction are arranged orthogonal to each other. At intersections between the respective word-lines 4 and the respective bit-lines 5, a plurality of active regions 10a forming the memory cell are arranged. In the peripheral region N, peripheral circuits such as the row decoder and the row address buffer (not illustrated) are provided. The word-lines 4 include word-lines 401, 402, 403, and 404 described later. The word-lines 4 are arranged such that the word-lines 401, 402, 403, and 404 are repeated.

The longitudinal direction of the active regions 10a is inclined by a predetermined angle with respect to the bit-lines 5. The word-lines 4 serve as gate electrodes of access transistors of memory cells provided to the active regions 10a. The bit-lines 5 are connected to the active regions 10a at their central portions in plan view via bit-line contacts 7. In each active region 10a, a capacitive contact 6 is arranged on a side opposite to the corresponding bit-line contact 7 of the bit-line 5. To each capacitive contact 6, a capacitor (not illustrated) is connected.

The word-lines 4 are arranged so as to linearly extend across the memory cell array region M and the peripheral region N. In the peripheral region N, word-line contacts 8 electrically connected to word-lines 4 (401, 403) are provided. The word-line contacts 8 are connected to the word-lines 4 (401, 403) at edge portions 9 of the word-lines 4. Each edge portion 9 corresponds to a portion where a word-line 4 and a word-line contact 8 overlaps.

In the peripheral region N, the word-line contacts 8 are connected to alternate word-lines 4 (401, 403). Adjacent to the word-lines 4 (401, 403) to which the word-line contacts 8 are connected, word-lines 4 (402, 404) to which the word-line contacts 8 are not connected are arranged. On the extension of each word-line 404 in the X direction, an offcut 4a is arranged. The word-line 404 is adjacent to one side of the word-line 403 to which the word-line contact 8 is connected. The offcut 4a is arranged on the extension, in the Y direction, of the edge portion 9 or the word-line contact 8 of the word-line 403.

Between each offcut 4a and the corresponding word-line 404, a wiring-cut region 4b where the word-line 4 does not exist is arranged. The wiring-cut region 4b is arranged near the boundary between the memory cell array region M and the peripheral region N. By the wiring-cut region 4b, the word-line 404 and the offcut 4a are separated physically and electrically. The offcut 4a is not connected to any word-lines 4, and is electrically floating. On the extension, in the X direction, of the word-line 402 on the other side to which no word-line contact 8 is connected, and next to the word-line contact 8, a wiring-nonexistent region 4c where the word-line 4 does not exist and is missing is provided.

In the memory-mat end region A illustrated in FIG. 2A, the word-line 403 is arranged between the word-line 402 and the word-line 404. Adjacent to the word-line 404, the word-line 403 is arranged. The word-line 404 is arranged between the word-line 403 and the corresponding word-line 401. Adjacent to the word-line 402, the word-line 403 is arranged. The word-line 402 is arranged between the word-line 403 and the corresponding word-line 401. The word-lines 4 (401 to 404) are arranged in the order described above so as to be repeatedly arranged in this order hereafter.

In the memory-mat end region A illustrated in FIG. 2A, each word-line 401 is longer than each word-line 402. The word-line 403 is longer than the word-line 402. On the extension of the word-line 402 in the X direction, the wiring-nonexistent region 4c where the word-line 4 does not exist is arranged adjacent to the edge portions 9 of the corresponding word-lines 4 (401, 403) in the Y direction. On the extension of the word-line 404 in the X direction, the offcut 4a is arranged adjacent to the edge portions 9 of the corresponding word-lines 4 (401, 403) in the Y direction. Between the word-line 404 and the offcut 4a, the wiring-cut region 4b is arranged. On the extension, in the X direction, of each word-line 4 (401, 403) to which the corresponding word-line contact 8 is connected, the offcut 4a, the wiring-cut region 4b, or the wiring-nonexistent region 4c is not arranged.

In the memory-mat end region A illustrated in FIG. 2A, when the word-lines 401, 403 are defined as odd-numbered word-lines 4, the word-lines 402, 404 are even-numbered word-lines 4. In this case, to each odd-numbered word-line 4, the corresponding word-line contact 8 is connected. On the extension of each even-numbered word-line 4 in the X direction, the wiring-nonexistent region 4c or the offcut 4a is arranged.

When the word-lines 401, 403 are defined as odd-numbered word-lines 4, in the memory-mat end region A illustrated in FIG. 2A, a word-line contact 801 is connected to each odd-numbered word-line 401, and a word-line contact 803 is connected to each odd-numbered word-line 403. In a region adjacent to one side of the word-line contact 801 in the Y direction, the offcut 4a is arranged, and in a region adjacent to the other side thereof, the wiring-nonexistent region 4c is arranged.

The offcut 4a is arranged in the region adjacent to the one side of the word-line contact 801 in the Y direction, and the wiring-nonexistent region 4c is arranged in the region adjacent to the other side. In a region adjacent to one side of the word-line contact 803 in the Y direction, the wiring-nonexistent region 4c is arranged, and in a region adjacent to the other side thereof, the offcut 4a is arranged. Between each word-line contact 801 and the corresponding word-line contact 803, the offcut 4a or the wiring-nonexistent region 4c is arranged.

The planar layout of the memory-mat end region B illustrated in FIG. 2B is a layout in which the arrangements of the offcut 4a, the wiring-cut region 4b, and the wiring-nonexistent region 4c are changed from the arrangements thereof in the memory-mat end region A. In the layout of the memory-mat end region B, the odd-numbered word-lines and the even-numbered word-lines in the memory-mat end region A are exchanged.

In the memory-mat end region B illustrated in FIG. 2B, to the even-numbered word-lines 4 (402, 404), word-line contacts 8 are connected. On the extension of each odd-numbered word-line 4 (401, 403) in the X direction, a wiring-nonexistent region 4c or an offcut 4a is arranged. The word-lines 402 and 404 in the peripheral region N of the memory-mat end region A lead to word-lines 4 to which the word-line contacts 8 are connected in the memory-mat end region B. Other than these arrangements, the configuration of the memory-mat end region B is substantially the same as the configuration of the memory-mat end region A.

In the memory-mat end region B illustrated in FIG. 2B, when the word-lines 402, 404 are defined as even-numbered word-lines 4, a word-line contact 802 is connected to each even-numbered word-line 402, and a word-line contact 804 is connected to each even-numbered word-line 404. In a region adjacent to one side of the word-line contact 802 in the Y direction, the offcut 4a is arranged, and in a region adjacent to the other side thereof, the wiring-nonexistent region 4c is arranged. In a region adjacent to one side of the word-line contact 804 in the Y direction, the wiring-nonexistent region 4c is arranged, and in a region adjacent to the other side thereof, the offcut 4a is arranged. Between each word-line contact 802 and the corresponding word-line contact 804, the offcut 4a or the wiring-nonexistent region 4c is arranged.

In the memory-mat end region B illustrated in FIG. 2B, each word-line 404 is longer than each word-line 401. The word-line 402 is longer than the word-line 403. On the extension of the word-line 401 in the X direction, the wiring-nonexistent region 4c where the word-line 4 does not exist is arranged adjacent to the edge portions 9 of the corresponding word-lines 4 (402 or 404) in the Y direction. On the extension of the word-line 403 in the X direction, the offcut 4a is arranged adjacent to the edge portions 9 of the corresponding word-lines 4 (402, 404). Between the word-line 403 and the offcut 4a, the wiring-cut region 4b is arranged. On the extension, in the X direction, of each word-line 4 (402, 404) to which the word-line contact 8 is connected, the offcut 4a, the wiring-cut region 4b, or the wiring-nonexistent region 4c is not arranged.

With the configuration described above, even if the position of a word-line contact 8 is displaced, an object that comes into contact with the word-line contact 8 is not present on the wiring-nonexistent region 4c side in the first place. Even if the word-line contact 8 comes into contact with the offcut 4a, the offcut 4a is not connected to any word-lines 4. By this configuration, even if the position of the word-line contact 8 is displaced in any manner, a short circuit with the adjacent word-lines 4 can be avoided or prevented. Thus, production yields of the semiconductor memory device 1 can be increased.

Figure 21:
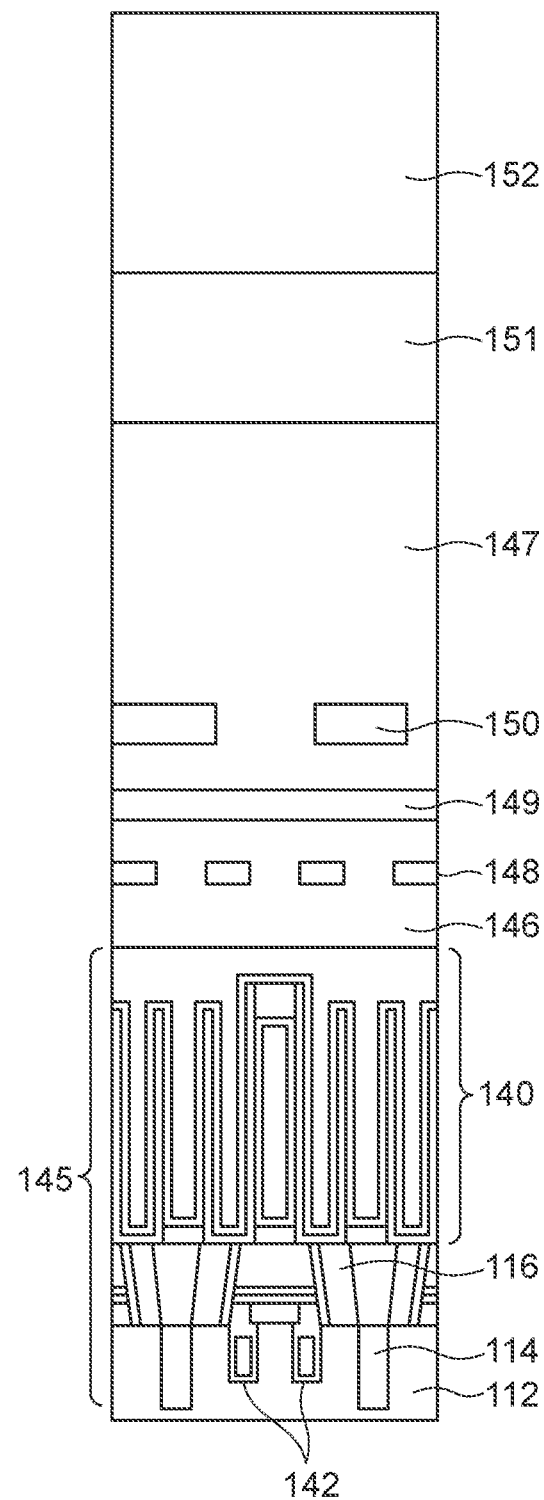
FIG. 21 is a vertical cross-sectional view illustrating one example of an entire schematic configuration of the memory cell region of the semiconductor memory device according to the embodiment.

FIG. 21 is a vertical cross-sectional view illustrating one example of an entire schematic configuration of the memory cell region of the semiconductor memory device according to the embodiment. As illustrated in FIG. 21, below a capacitor 140, a semiconductor substrate 112, a shallow trench isolation 114, an access transistor 142, and a capacitive contact 116, for example, included in a memory cell 145 of a DRAM are provided. The capacitor 140 is provided above the semiconductor substrate 112 on which the shallow trench isolation 114, the access transistor 142, and the capacitive contact 116, for example, are formed. The semiconductor substrate 112 corresponds to a semiconductor substrate 10 described later.

The lower electrode of the capacitor 140 illustrated in FIG. 21 is electrically connected, via the capacitive contact 116, to one of source and drain regions of the access transistor 142 formed in an active region of the semiconductor substrate 112. The lower electrode of the capacitor 140 is connected to the semiconductor substrate 112. The gate electrode of the access transistor 142 corresponds to each word-line 4 in FIG. 1B, FIG. 2A, and FIG. 2B, for example.

As illustrated in FIG. 21, above the capacitor 140, multilevel upper wiring layers 148, 149, 150, and 151 are provided. The upper layers are arranged on the upper side of the memory cell 145. The upper electrode of the capacitor 140 is arranged on the side of the multilevel upper wiring layers 148, 149, 150, and 151. The elements 146, 147, 152 illustrated in FIG. 21 contain insulating material.

In upper areas in the diagrams illustrated in FIGS. 20B to 20F, the capacitor 140 and the upper layers are provided in the same manner as the configuration illustrated in FIG. 21.

Figure 22:
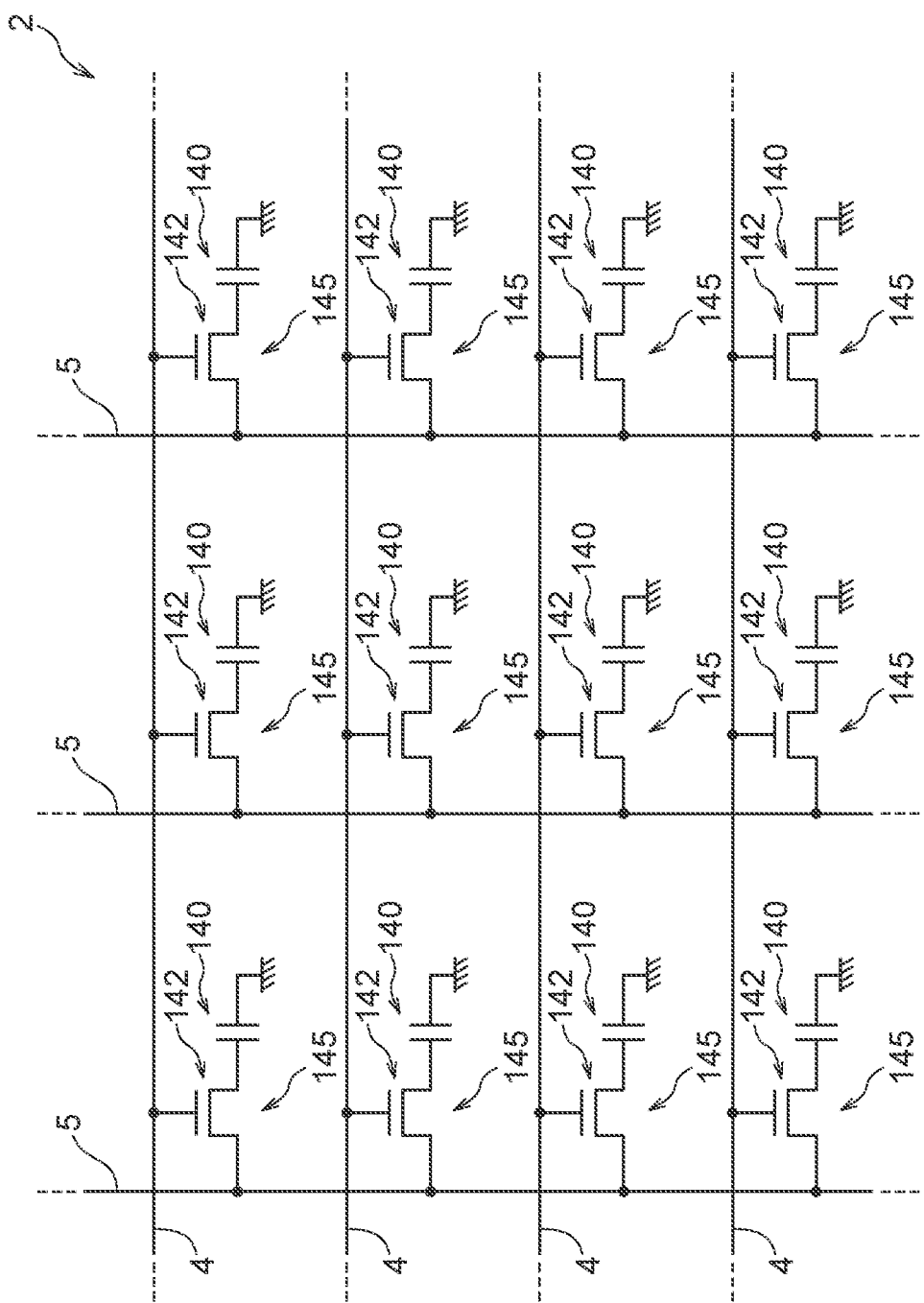
FIG. 22 is a circuit diagram illustrating a schematic configuration of an equivalent circuit of a memory cell of the semiconductor memory device according to the embodiment.

FIG. 22 illustrates an equivalent circuit of a memory cell array of the semiconductor memory device according to the embodiment. A plurality of the memory cells 145 are arranged in the form of a matrix so as to be connected to intersections of a plurality of word-lines 4 and a plurality of bit-lines 5 that are arranged orthogonal to each other. Each memory cell 145 includes an access transistor 142 and a capacitor 140 in a pair.

Examples of the access transistor 142 include a metal-oxide-semiconductor field-effect transistor (MOSFET). The gate electrode of the access transistor 142 serves as a word-line 4 of a DRAM. The word-line 4 serves as a control line to control selection of the corresponding memory cell. One of the source and the drain of the access transistor 142 is connected to the corresponding bit-line 5, and the other thereof is connected to the capacitor 140. The capacitor 140 includes a condenser, and electric charge is accumulated therein to store data.

When data is written to the memory cell 145, potential to turn on the access transistor 142 is applied to the word-line 4, and low potential or high potential corresponding to write data "0" or "1" is applied to the bit-line 5. When data is read from the memory cell 145, potential to turn on the access transistor 142 is applied to the word-line 4. By this operation, the potential led from the capacitor 140 to the bit-line 5 is sensed by a sense amplifier connected to the bit-line 5, whereby the data is assessed.

The method of manufacturing the semiconductor memory device according to the embodiment will be described with reference to FIG. 3A, FIG. 3B to FIG. 10A, FIG. 10B, and FIGS. 11A to 11F to FIGS. 20A to 20F. FIG. 3A, FIG. 3B to FIG. 10A, FIG. 10B, and FIGS. 11A to 11F to FIGS. 20A to 20F are diagrams illustrating the schematic configuration of the memory-mat end region A in FIG. 2A in the order of processes.

Figure 3A:
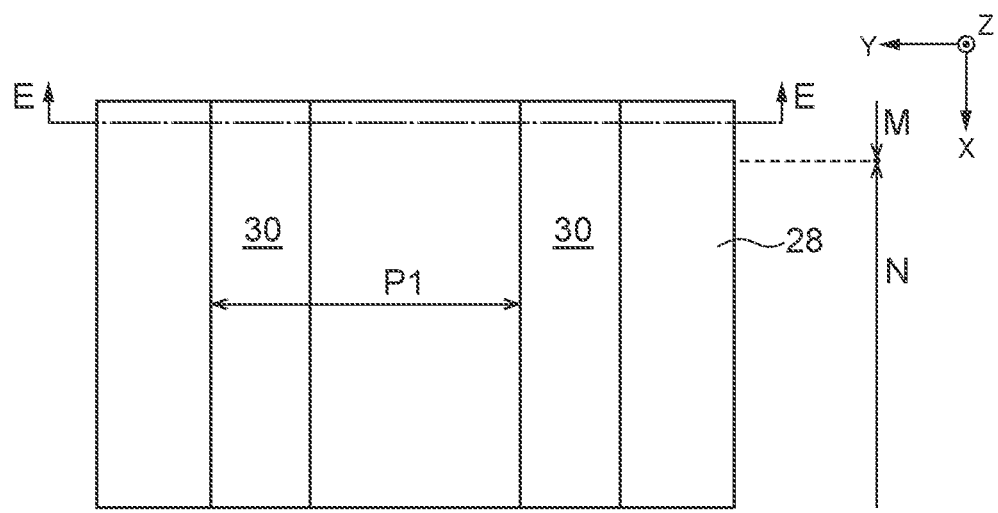
FIGS. 3A and 3B, FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A to 11F, FIGS. 12A to 12F, FIGS. 13A to 13F, FIGS. 14A to 14F, FIGS. 15A to 15F, FIGS. 16A to 16F, FIGS. 17A to 17F, FIGS. 18A to 18F, FIGS. 19A to 19F, and FIGS. 20A to 20F are diagrams illustrating the semiconductor memory device and a method of manufacturing it according to the embodiment, in which examples of schematic configurations in exemplary processing stages are illustrated in the order of processes.
Figure 3B:
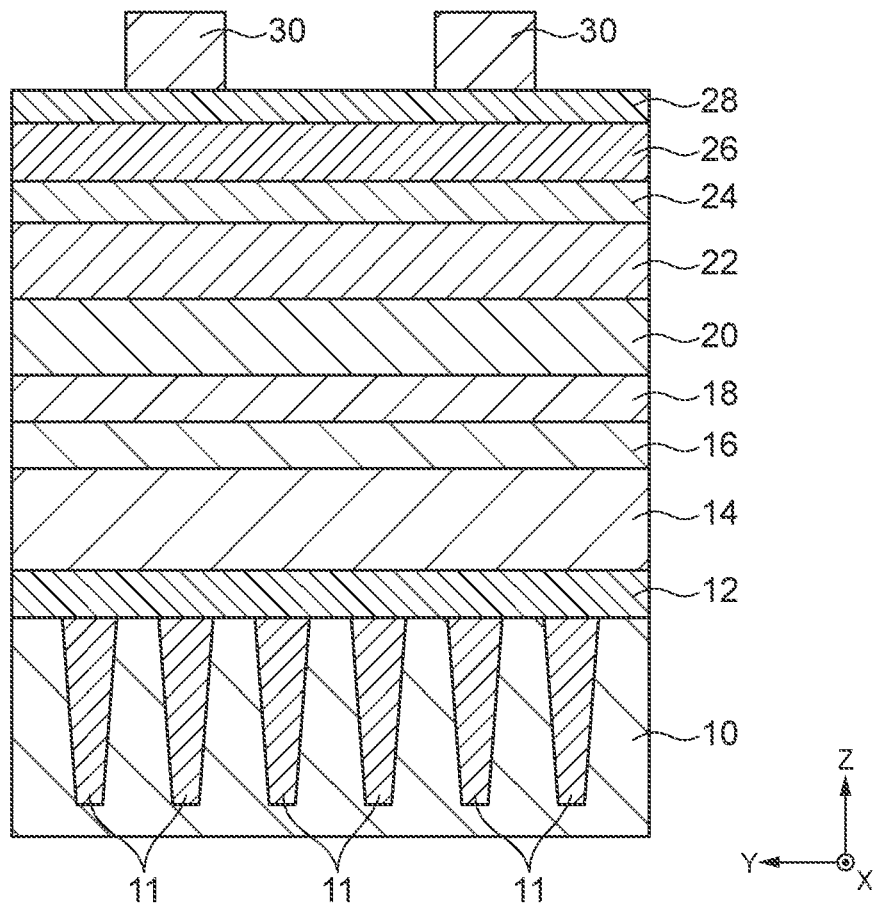

As illustrated in FIG. 3A and FIG. 3B, on the semiconductor substrate 10, a first insulating film 12, a first sacrifice film 14, a second sacrifice film 16, a third sacrifice film 18, a fourth sacrifice film 20, a fifth sacrifice film 22, a sixth sacrifice film 24, a seventh sacrifice film 26, an eighth sacrifice film 28, and resists 30 are formed.

Examples of the semiconductor substrate 10 include a silicon single-crystal substrate. In the semiconductor substrate 10, isolations 11 are formed. The isolations 11 are formed by forming trenches in the semiconductor substrate 10 and embedding insulating material containing silicon nitride (SiN) and silicon dioxide ($SiO_2$), for example, in these trenches.

The first insulating film 12 includes an insulating film containing silicon dioxide, for example. The first sacrifice film 14 contains amorphous carbon ($\alpha$-C), for example. The second sacrifice film 16 contains silicon oxynitride (SiON), for example. The third sacrifice film 18 contains silicon dioxide, for example. The fourth sacrifice film 20 contains polysilicon (Poly-Si), for example. The fifth sacrifice film 22 contains amorphous carbon, for example. The sixth sacrifice film 24 contains silicon oxynitride, for example. The seventh sacrifice film 26 contains amorphous carbon, for example. The eighth sacrifice film 28 contains silicon-containing amorphous carbon, for example.

The first insulating film 12, the first sacrifice film 14, the second sacrifice film 16, the third sacrifice film 18, the fourth sacrifice film 20, the fifth sacrifice film 22, the seventh sacrifice film 26, and the eighth sacrifice film 28 are formed by chemical vapor deposition (CVD), for example. The sixth sacrifice film 24 is formed by a thermal CVD method of, while feeding deposition gas onto a substrate such as a silicon wafer, heating the silicon wafer or a plasma CVD method, for example. Examples of the deposition gas include silane gas as a silicon source and dinitrogen monoxide ($N_2O$) gas as a source of nitrogen and oxygen.

A plurality of the resists 30 are patterned by using a known lithography technique. The resists 30 are arranged in a plurality of line-and-space shapes each extending linearly in the X direction and aligned in parallel in the Y direction in FIG. 3A. The resists 30 are patterned in a line-and-space arrangement so as to each extend in the X direction and be aligned in parallel in the Y direction with the same dimensions and the same repeating pitch P1.

Figure 4A:
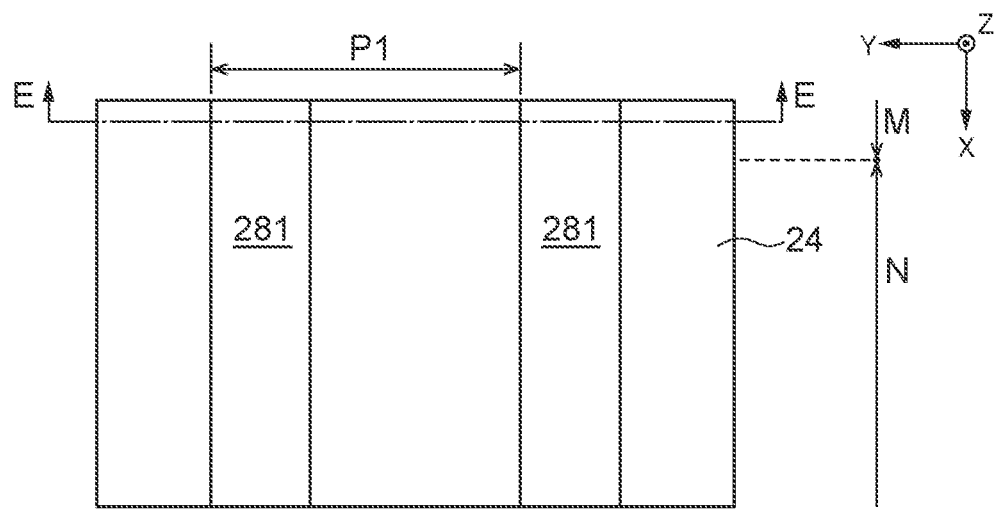
Figure 4B:
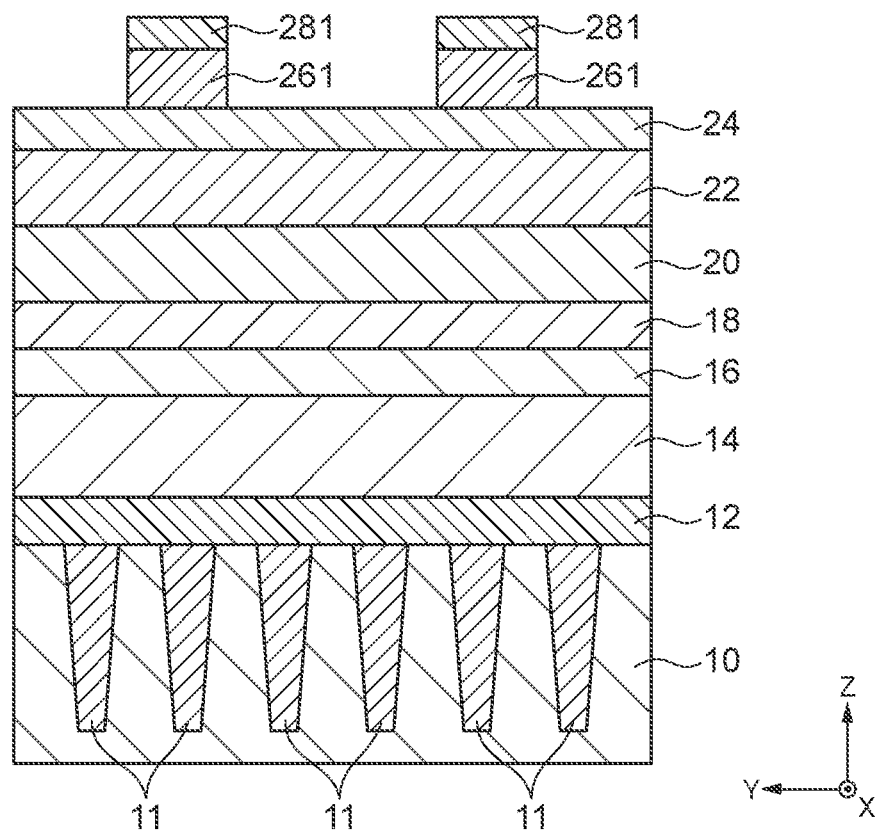

Subsequently, as illustrated in FIG. 4A and FIG. 4B, the resists 30 are used as an etching mask, and the eighth sacrifice film 28 and the seventh sacrifice film 26 are anisotropically dry etched to form transfer patterns 281 and transfer patterns 261. In regions where the transfer patterns 281 and the transfer patterns 261 do not exist, the upper surface of the sixth sacrifice film 24 is exposed. The transfer patterns 281 and the transfer patterns 261 have line-and-space shapes in the same manner as the resists 30. The transfer patterns 281 and the transfer patterns 261 have the same repeating pitch P1 as that of the resists 30.

Figure 5A:
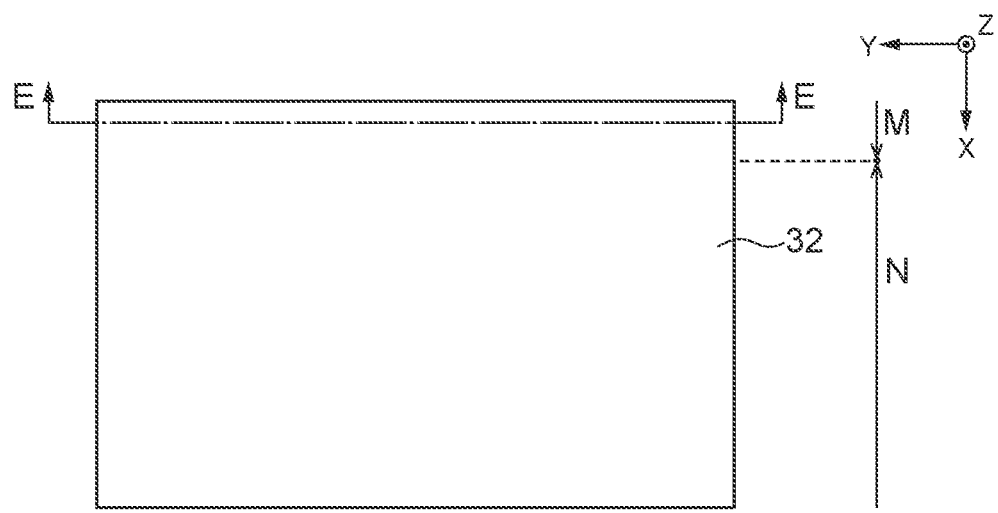
Figure 5B:
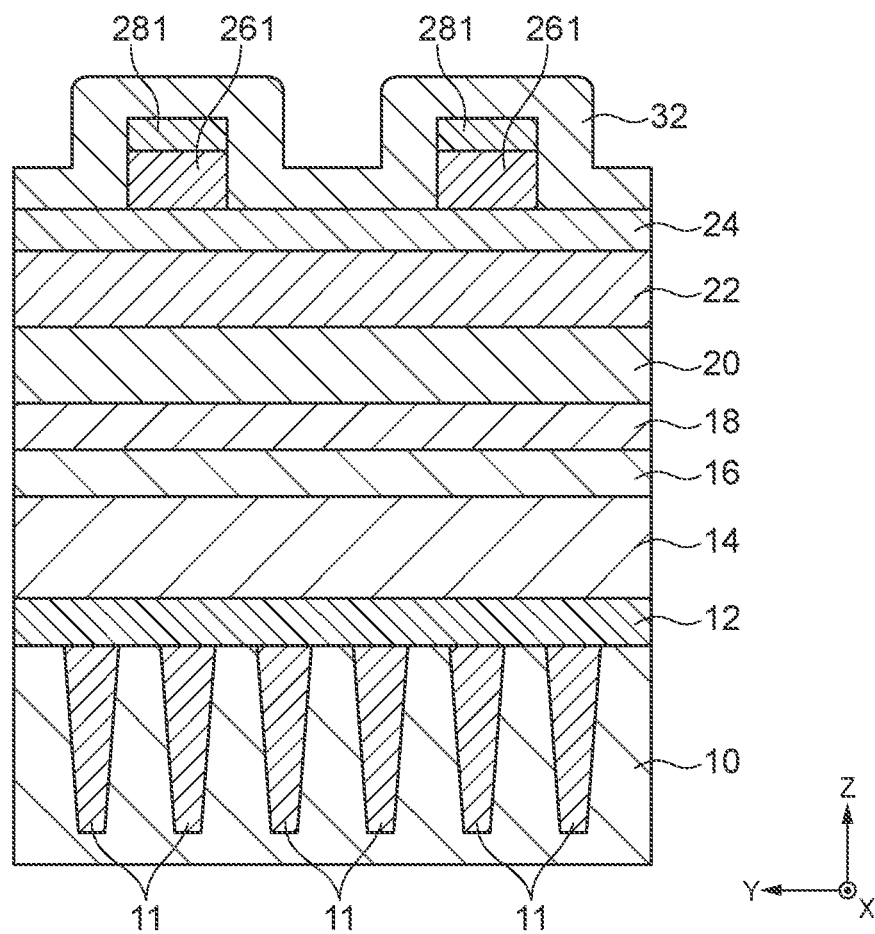

Subsequently, as illustrated in FIG. 5A and FIG. 5B, a ninth sacrifice film 32 is formed so as to cover the upper surface of the sixth sacrifice film 24, the transfer patterns 261, and the transfer patterns 281. The ninth sacrifice film 32 contains silicon dioxide, for example. The ninth sacrifice film 32 is formed by CVD, for example. The ninth sacrifice film 32 is formed to fit to the shapes of the transfer patterns 261 and the transfer patterns 281. The film thickness of the ninth sacrifice film 32 is set so as to achieve the same dimensions as those of transfer patterns 221 illustrated in FIG. 6A and FIG. 6B described later.

Figure 6A:
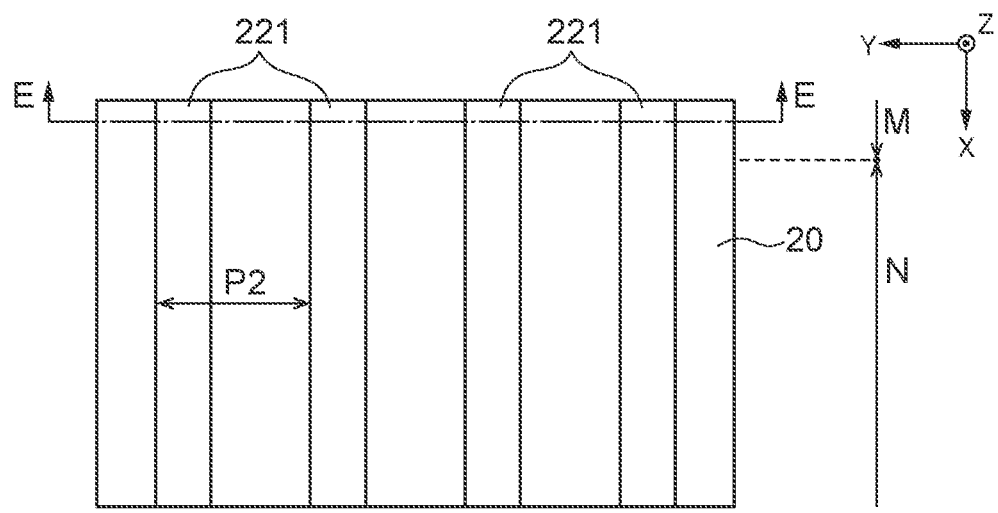
Figure 6B:
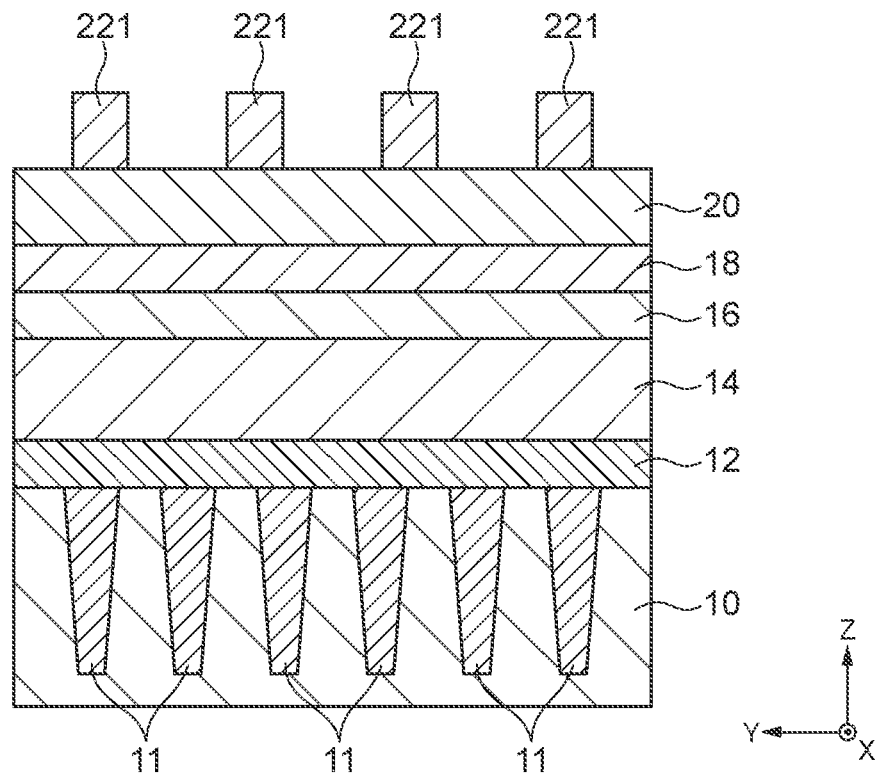

Subsequently, as illustrated in FIG. 6A and FIG. 6B, the ninth sacrifice film 32 is etched back by anisotropic dry etching, whereby the ninth sacrifice film 32 is left remaining at side walls of the transfer patterns 261 and the transfer patterns 281. Subsequently, the transfer patterns 261 and the transfer patterns 281 are removed. With the remaining ninth sacrifice film 32 used as an etching mask, the sixth sacrifice film 24 and the fifth sacrifice film 22 are anisotropically dry etched. By this dry etching, the upper surface of the fourth sacrifice film 20 is exposed.

Subsequently, the ninth sacrifice film 32 is removed. By the above-described processes, a plurality of the transfer patterns 221 are formed. The transfer patterns 221 are patterned in a line-and-space arrangement so as to each extend in the X direction and be aligned in parallel in the Y direction with the same dimensions and the same repeating pitch. The transfer patterns 221 have a repeating pitch P2 in the Y direction. The repeating pitch P2 is one-half the repeating pitch P1.

Figure 7A:
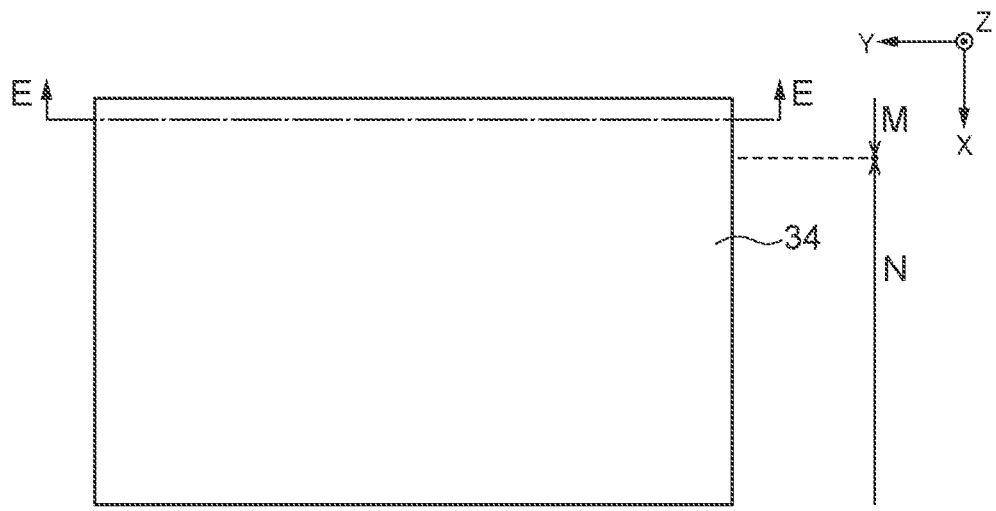
Figure 7B:
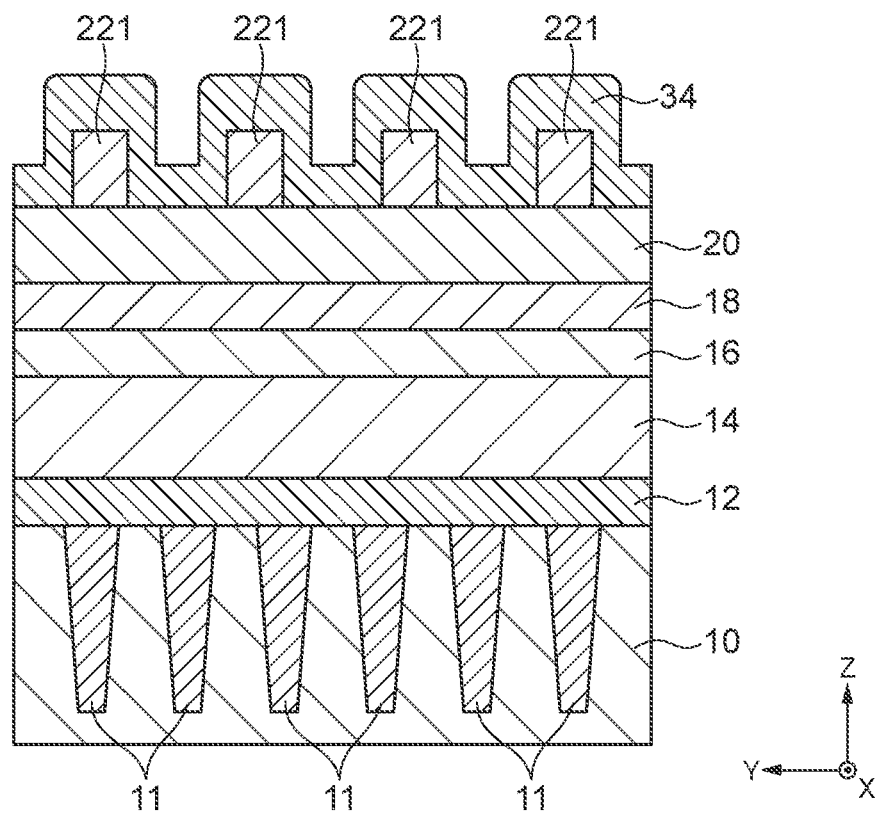

Subsequently, as illustrated in FIG. 7A and FIG. 7B, a tenth sacrifice film 34 is formed so as to cover the upper surface of the fourth sacrifice film 20 and the transfer patterns 221. The tenth sacrifice film 34 contains silicon dioxide, for example. The tenth sacrifice film 34 is formed by CVD, for example. The tenth sacrifice film 34 is formed to fit to the shapes of the transfer patterns 221. The film thickness of the tenth sacrifice film 34 is set so as to achieve the same dimensions as those of transfer patterns 201 illustrated in FIG. 8A and FIG. 8B described later.

Figure 8A:
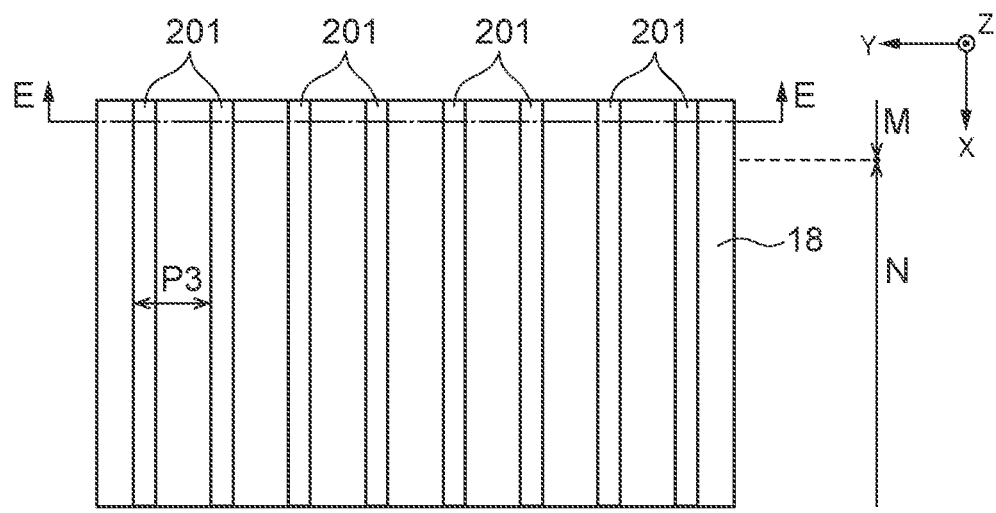
Figure 8B:
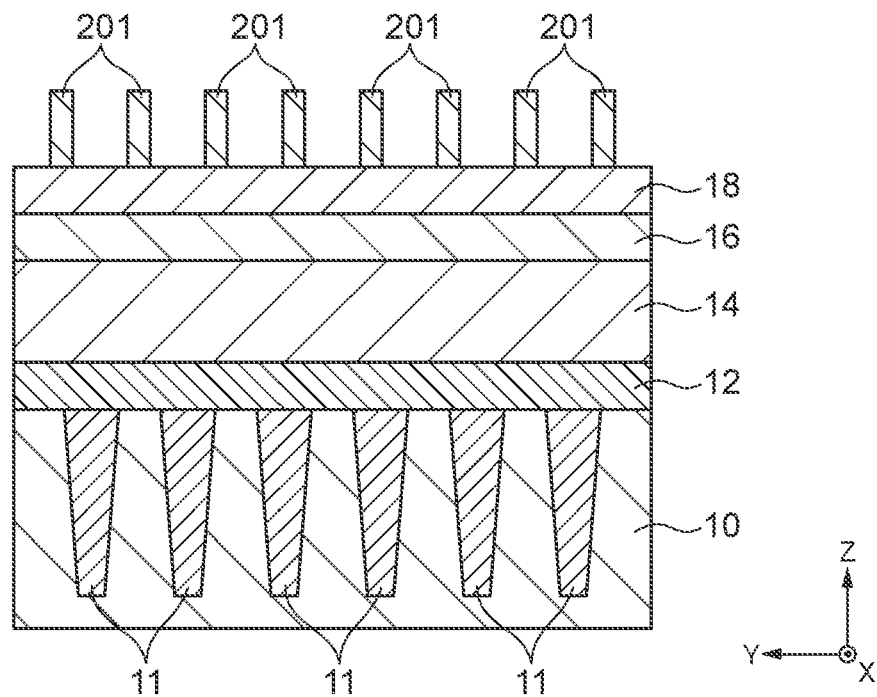

Subsequently, as illustrated in FIG. 8A and FIG. 8B, the tenth sacrifice film 34 is etched back by anisotropic dry etching, whereby the tenth sacrifice film 34 is left remaining at side walls of the transfer patterns 221, and then the transfer patterns 221 are removed. Subsequently, with the remaining tenth sacrifice film 34 used as an etching mask, the fourth sacrifice film 20 is anisotropically dry etched. By this dry etching, the upper surface of the third sacrifice film 18 is exposed. Subsequently, the tenth sacrifice film 34 is removed.

By the above-described processes, a plurality of the transfer patterns 201 are formed. The transfer patterns 201 are patterned in a line-and-space arrangement so as to each extend linearly in the X direction and be aligned in parallel in the Y direction with the same dimensions and the same repeating pitch. The transfer patterns 201 have a repeating pitch P3 in the Y direction. The repeating pitch P3 is one-half the repeating pitch P2, and is one-quarter the repeating pitch P1.

The processes described with reference to FIG. 3A and FIG. 3B to FIG. 8A and FIG. 8B are called a multiple patterning technique such as a double patterning technique or a quadruple patterning technique. When the multiple patterning technique is used, patterns having a repeating pitch that is one-half or one-quarter the resolution limit dimension of an exposure device in the lithography technique can be formed.

By the double patterning technique, a pitch doubling process is performed on original patterns, whereby patterns having a repeating pitch that is one-half the repeating pitch of the original patterns is formed. In the quadruple patterning technique, the double patterning (pitch doubling) technique is performed twice. By this process, patterns having a repeating pitch that is one-quarter the repeating pitch of the original patterns can be formed.

Figure 9A:
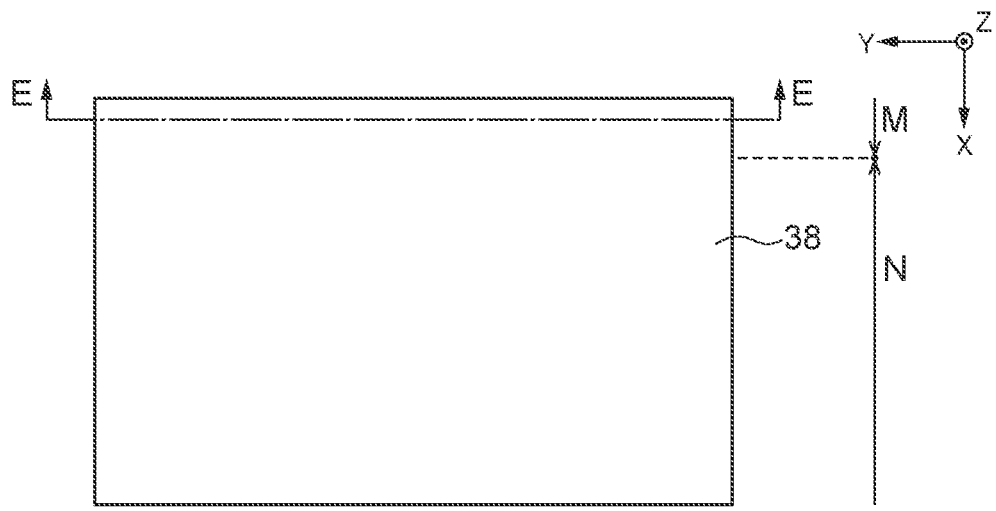
Figure 9B:
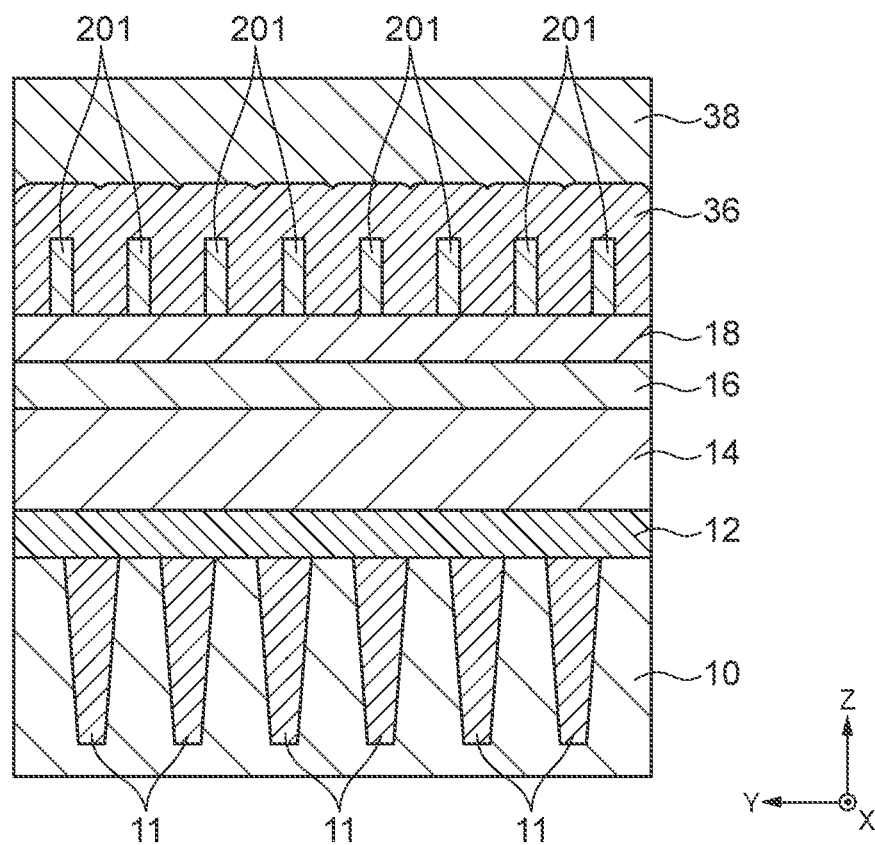

Subsequently, as illustrated in FIG. 9A and FIG. 9B, an eleventh sacrifice film 36 is formed so as to cover the upper surface of the third sacrifice film 18 and the transfer patterns 201, and further a twelfth sacrifice film 38 is formed on the eleventh sacrifice film 36. The eleventh sacrifice film 36 contains silicon dioxide, for example. The twelfth sacrifice film 38 contains amorphous carbon, for example. The eleventh sacrifice film 36 and the twelfth sacrifice film 38 are formed by CVD, for example.

Figure 10A:
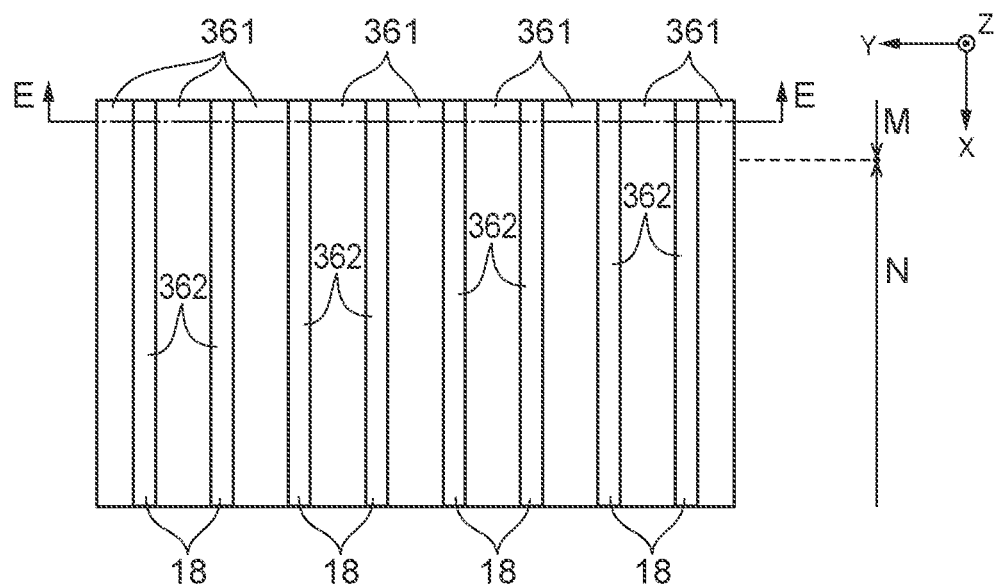
Figure 10B:
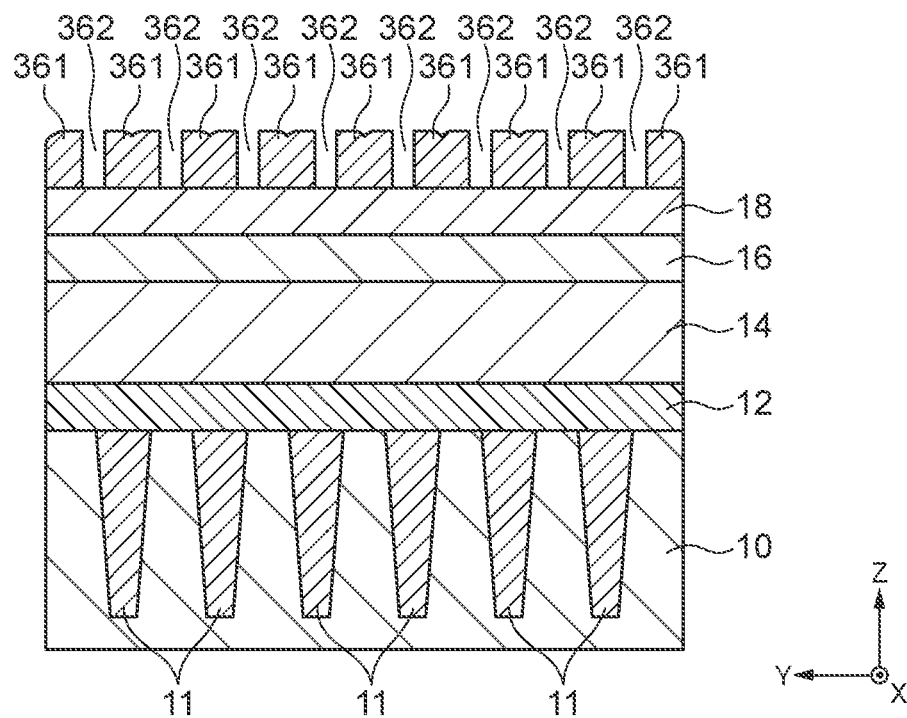

Subsequently, as illustrated in FIG. 10A and FIG. 10B, the twelfth sacrifice film 38 and the eleventh sacrifice film 36 are etched back by anisotropic dry etching, whereby top portions of the transfer patterns 201 are exposed. Subsequently, the transfer patterns 201 are selectively removed. The transfer patterns 201 can be removed by dry etching, for example. Alternatively, the transfer patterns 201 can be removed by wet etching using a mixed solution of nitric acid ($HNO_3$) and hydrofluoric acid (HF). By this process, transfer patterns 361 corresponding to patterns of the transfer patterns 201 with the light and shade reversed are formed.

Spaces are formed between the respective transfer patterns 361 to form slit patterns 362. In the slit patterns 362, the upper surface of the third sacrifice film 18 is exposed. The slit patterns 362 are patterns that are formed with the transfer patterns 201 used as original molds illustrated in FIG. 8A, for example. Thus, the slit patterns 362 are arranged having the same repeating pitch P3 as that of the transfer patterns 201.

Subsequently, as illustrated in FIG. 11A to FIG. 11F, a thirteenth sacrifice film 42 is formed so as to cover the upper surface of the third sacrifice film 18 and the transfer patterns 361, and a resist 44 is formed on the thirteenth sacrifice film 42. The resist 44 is formed in the peripheral region N. The resist 44 is patterned by using a known lithography technique, and is formed including a plurality of protruding patterns 441 and a plurality of isolated patterns 442.

The protruding patterns 441 are connected to the resist 44, and protrude toward the memory cell array region M. The protruding patterns 441 are formed so as to cover areas above end portions of slit patterns 362. Between adjacent protruding patterns 441, three slit patterns 362 exist. Thus, the repeating pitch of the protruding patterns 441 is four times longer than the repeating pitch P3 of the slit patterns 362, and the protruding patterns 441 are arranged having the same repeating pitch as the repeating pitch P1 of the resists 30 illustrated in FIG. 3A, for example.

Because the patterns of the slit patterns 362 are transferred to word-lines 4 in the end, the repeating pitch of the word-lines 4 is P3. Thus, the repeating pitch of the protruding patterns 441 is four times longer than the repeating pitch P3 of the word-lines 4 and, in other words, is the repeating pitch P1. For example, when the resolution limit of an exposure device is the repeating pitch P1, the protruding patterns 441 can be patterned by a lithography process using this exposure device.

The isolated patterns 442 are separated from the resist 44 to be arranged on a side closer to the memory cell array region M, and thus are island patterns. The isolated patterns 442 are arranged above slit patterns 362. End portions of the slit patterns 362 in the X direction are not covered by the isolated patterns 442. The isolated patterns 442 are arranged so as to cover areas above portions other than the end portions of the slit patterns 362 in the X direction. Between adjacent isolated patterns 442, three slit patterns 362 exist. Thus, the repeating pitch of the isolated patterns 442 is four times longer than the repeating pitch P3 of the slit patterns 362, and the isolated patterns 442 are arranged having the same repeating pitch as the repeating pitch P1 of the resists 30 illustrated in FIG. 3A, for example.

Because the repeating pitch of the word-lines 4 is P3, the repeating pitch of the protruding patterns 441 is four times longer than the repeating pitch P3 of the word-lines 4. For example, when the resolution limit of an exposure device is the repeating pitch P1, the isolated patterns 442 can be patterned by a lithography process using this exposure device. The protruding patterns 441 and the isolated patterns 442 do not exist above the same slit patterns 362. Between each protruding pattern 441 and the corresponding isolated pattern 442, one slit pattern 362 exists.

Figure 11A:
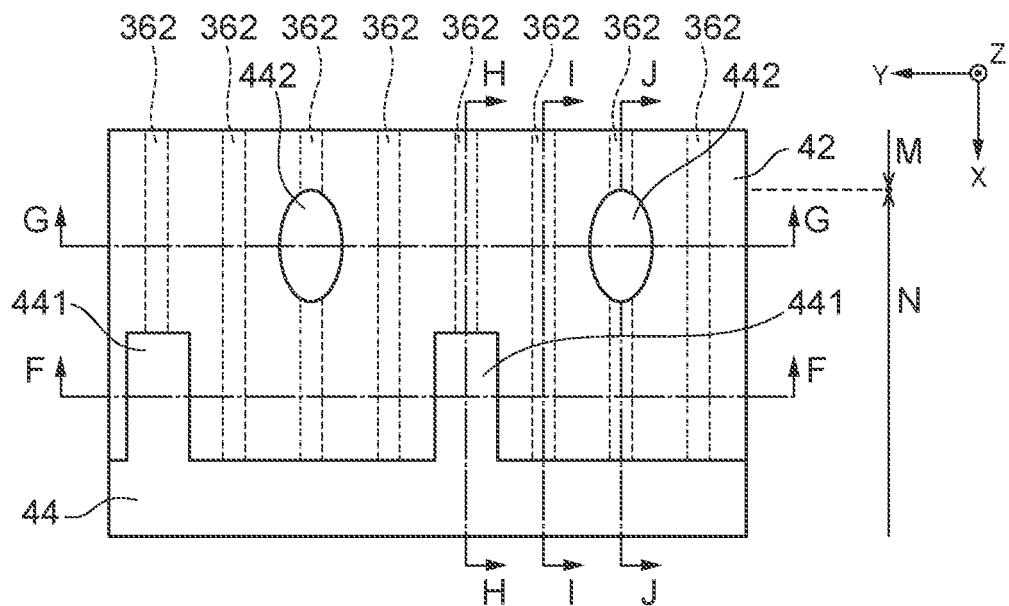
Figure 11B:
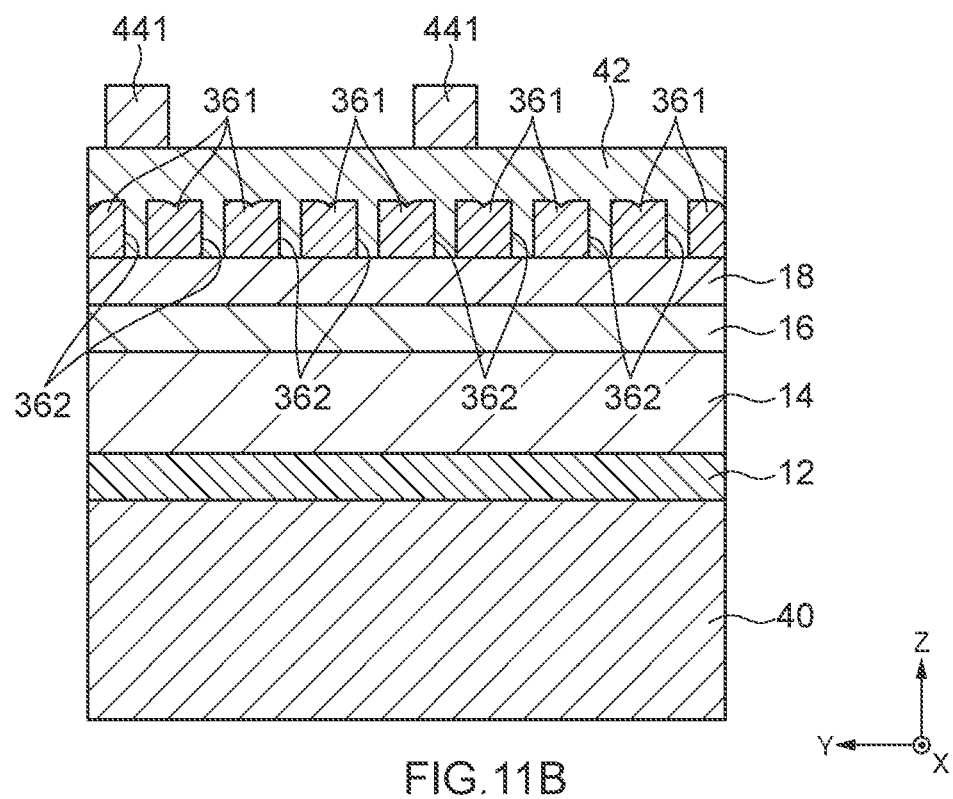
Figure 11C:
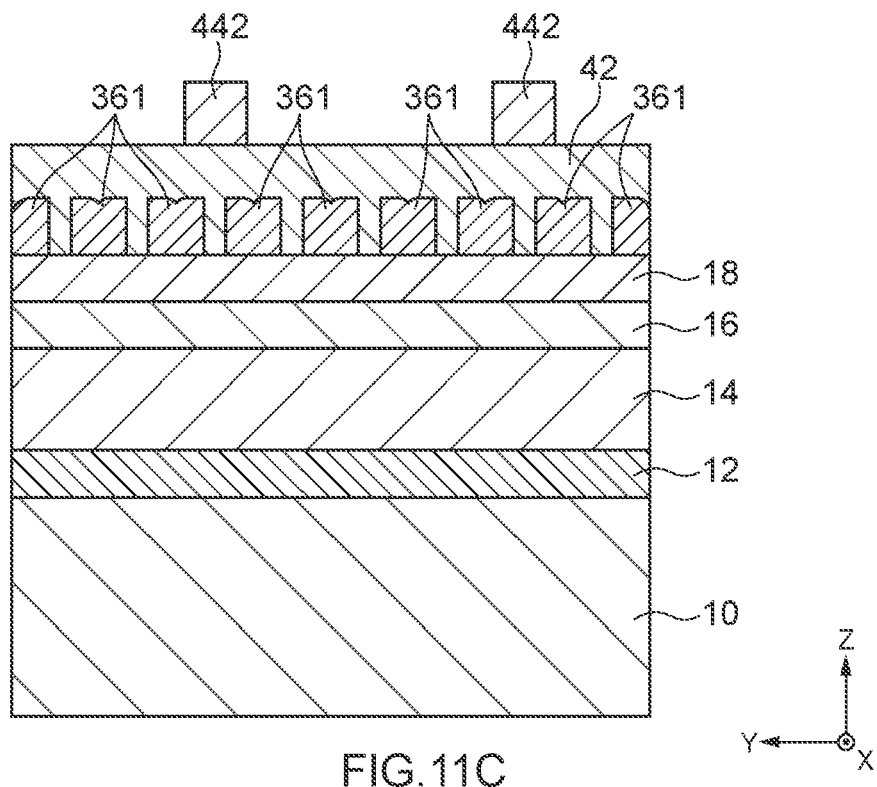
Figure 11D:
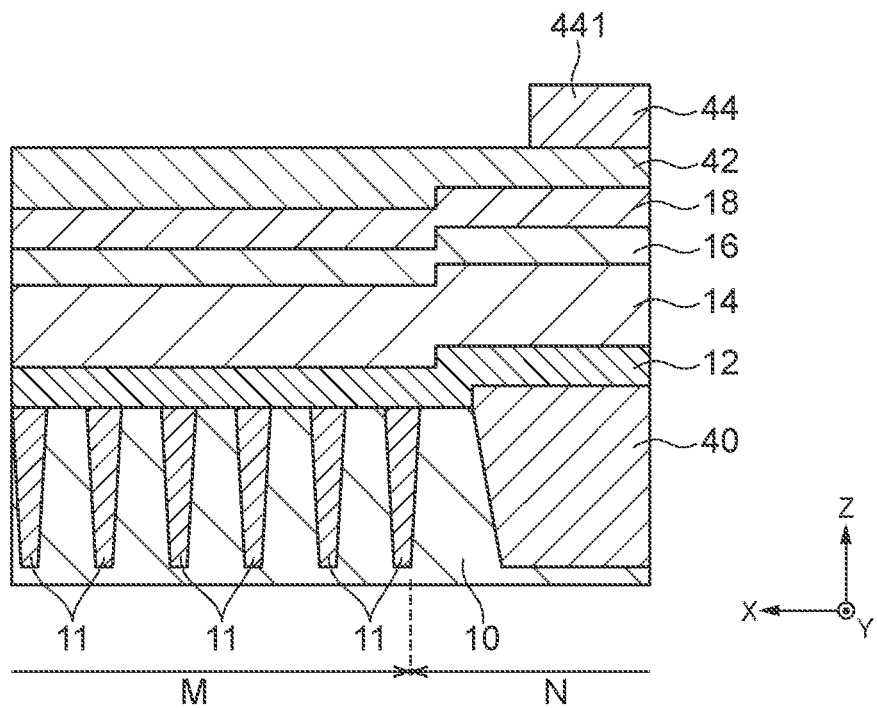
Figure 11E:
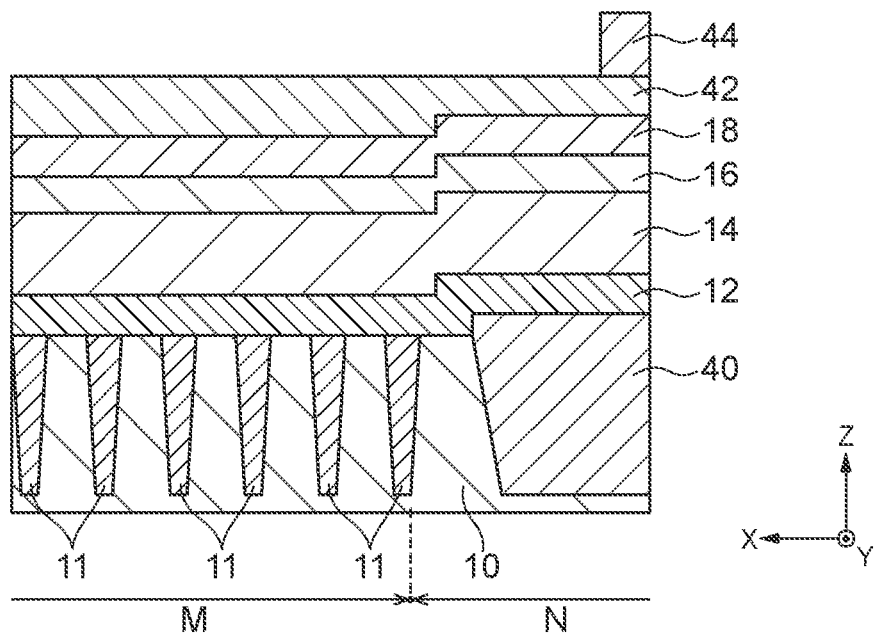
Figure 11F:
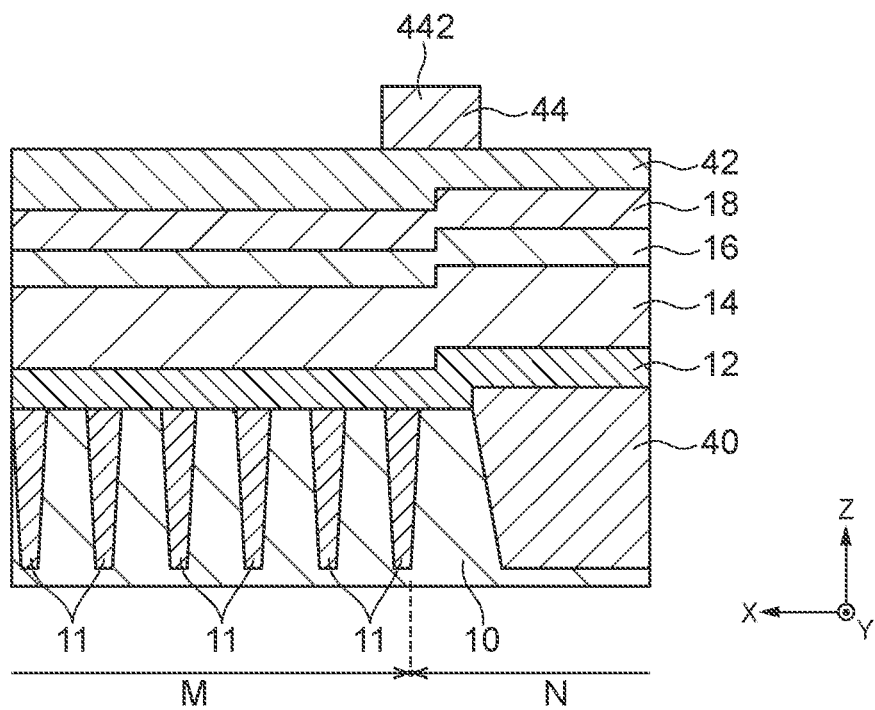
Figure 12A:
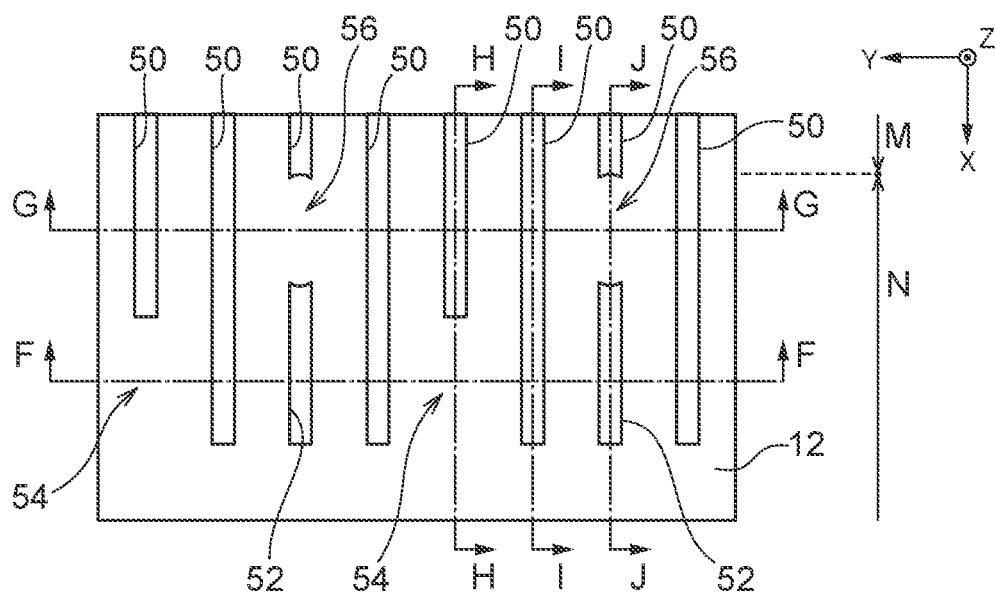
Figure 12B:
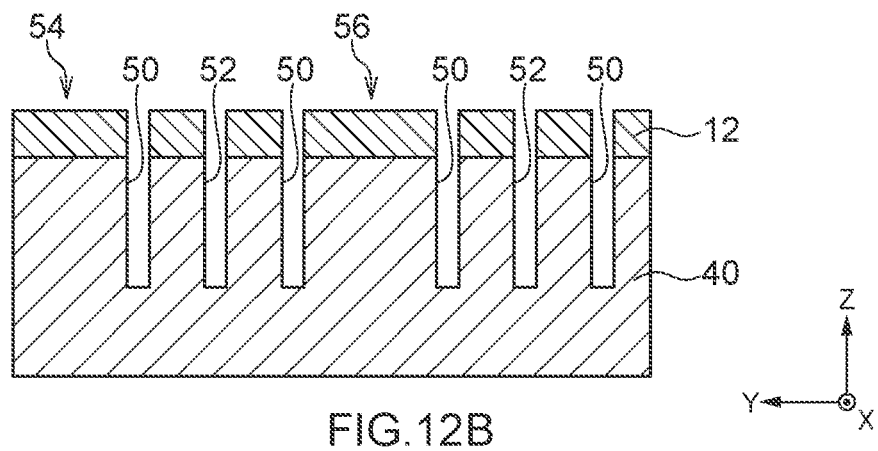
Figure 12C:
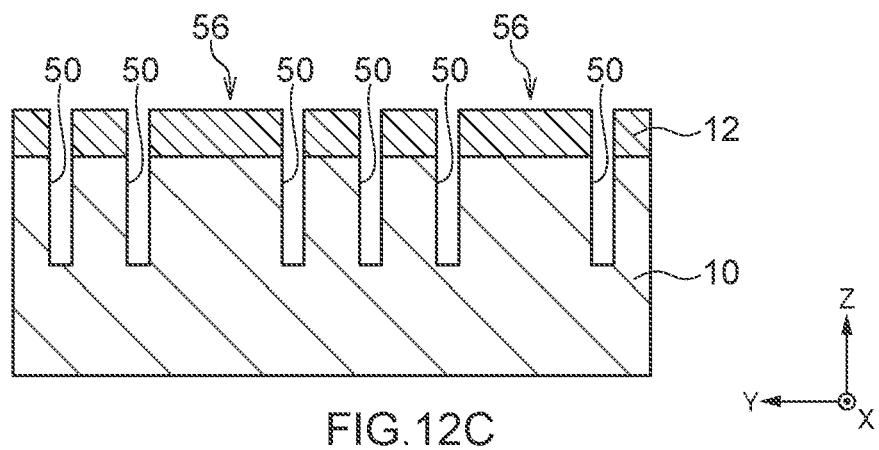
Figure 12D:
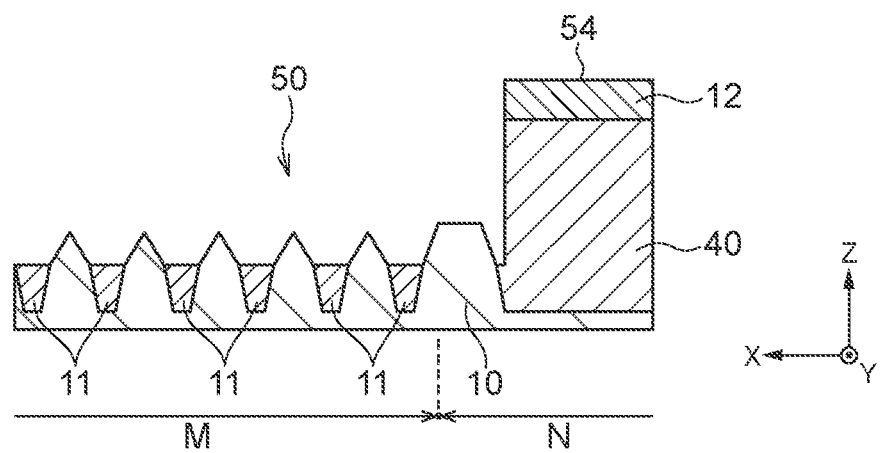
Figure 12E:
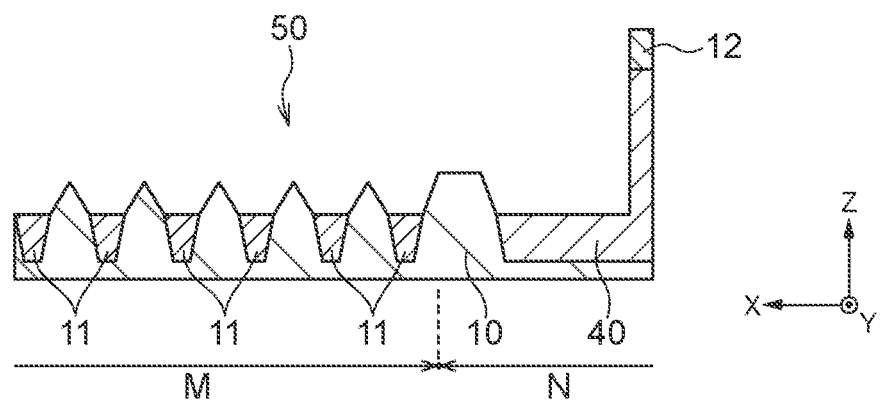
Figure 12F:
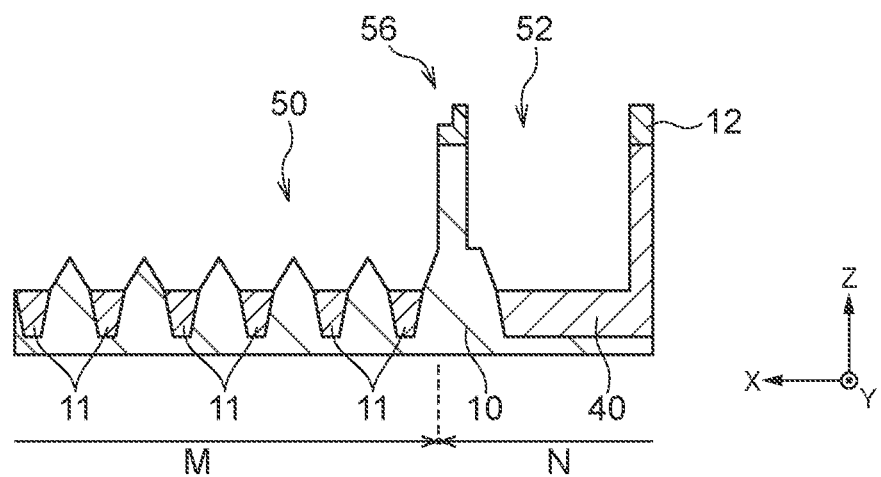
Figure 13A:
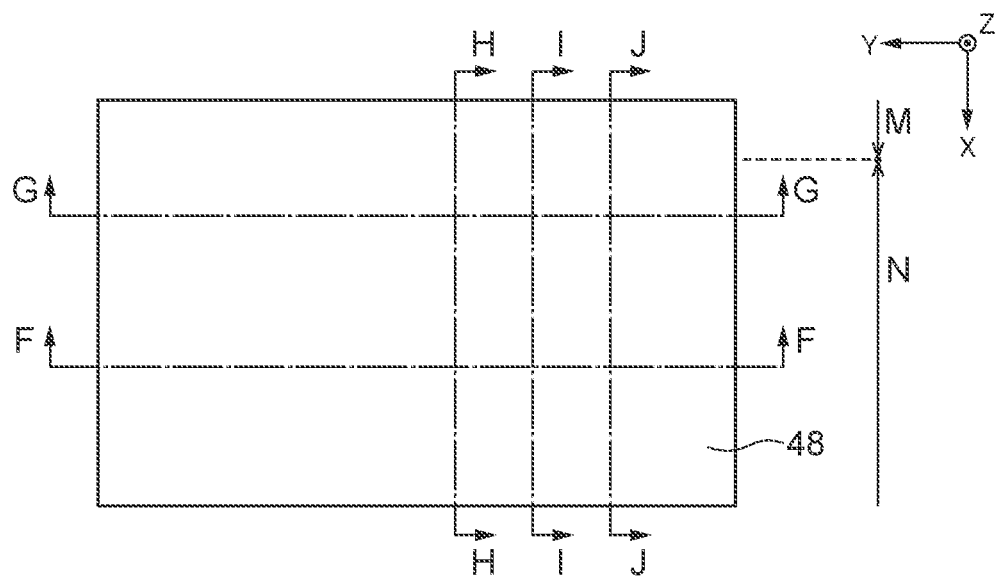
Figure 13B:
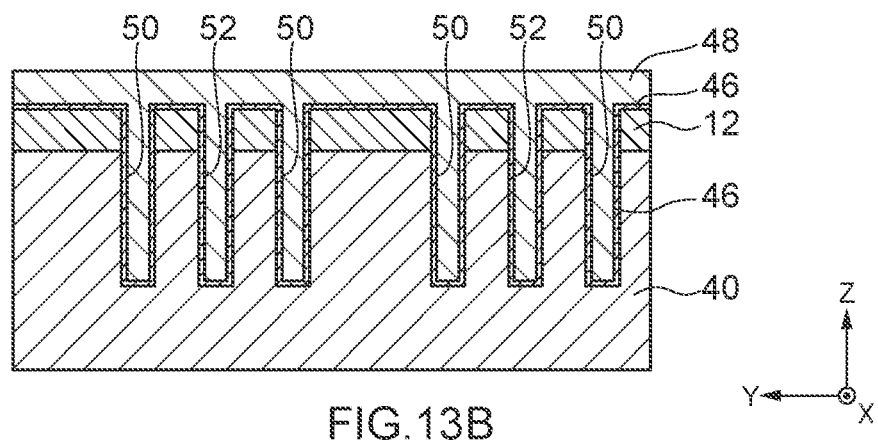
Figure 13C:
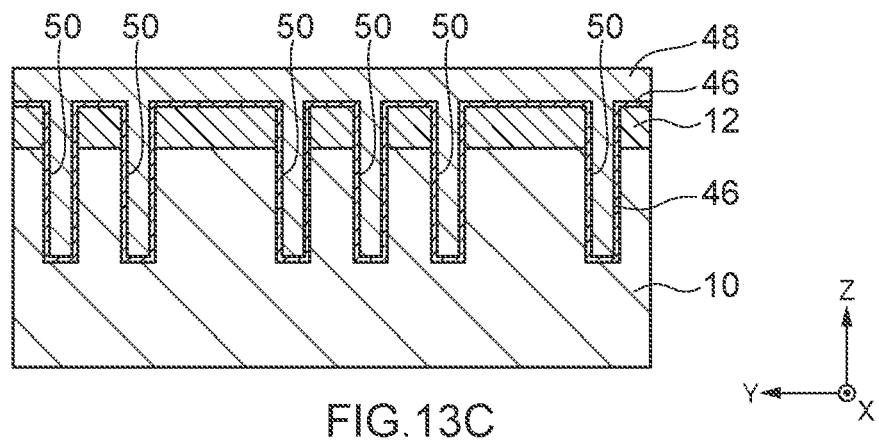
Figure 13D:
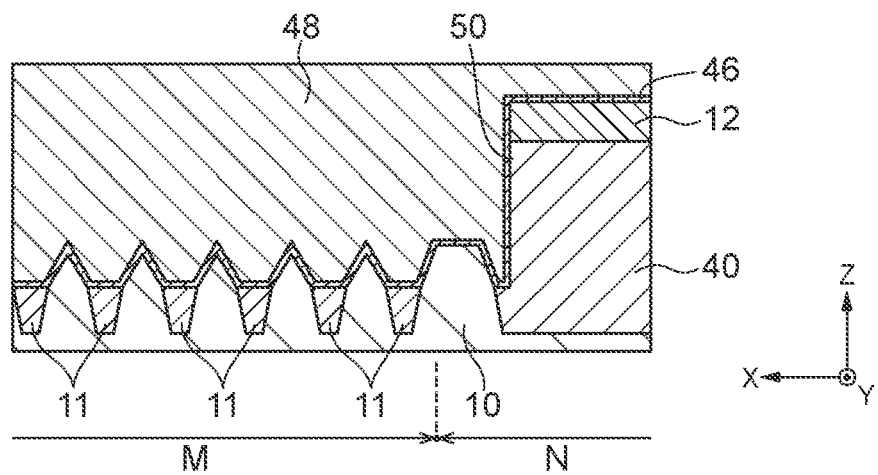
Figure 13E:
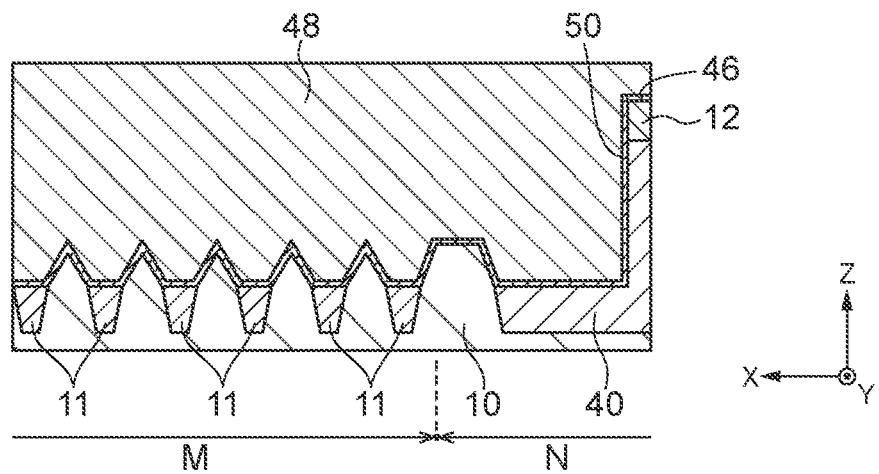
Figure 13F:
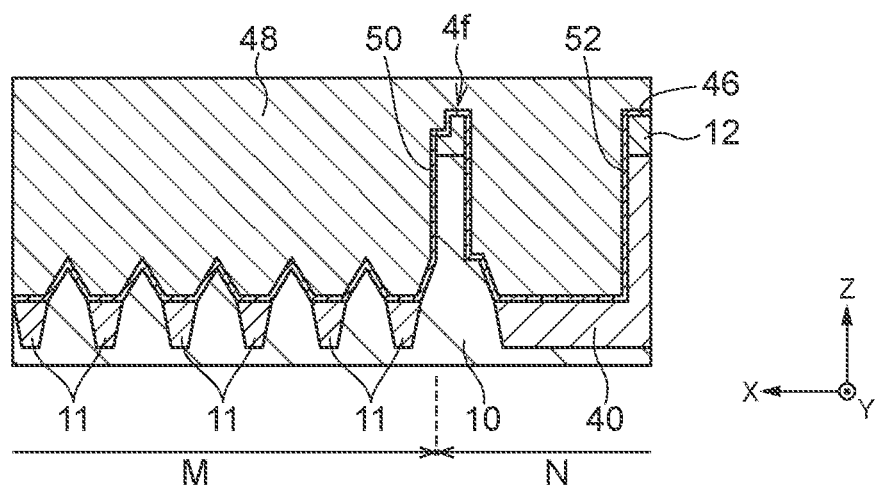
Figure 14A:
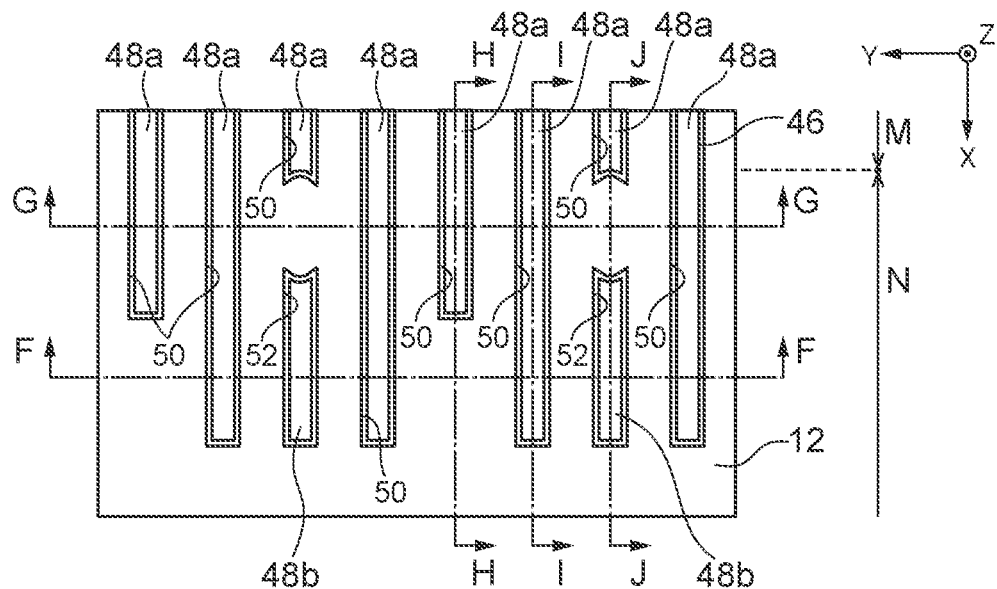
Figure 14B:
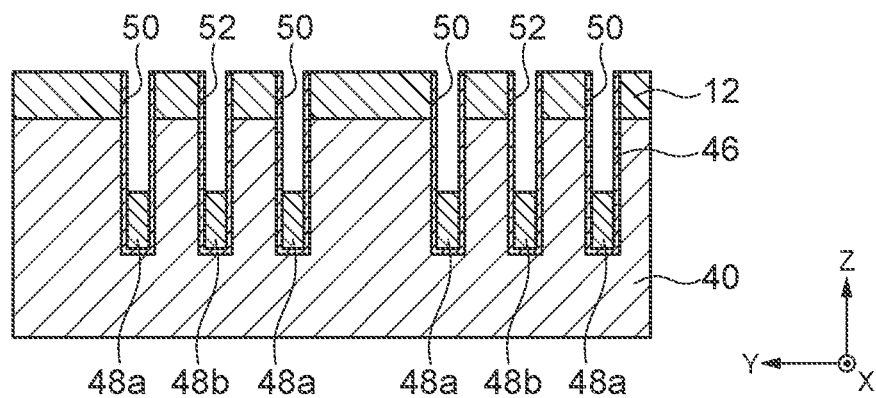
Figure 14C:
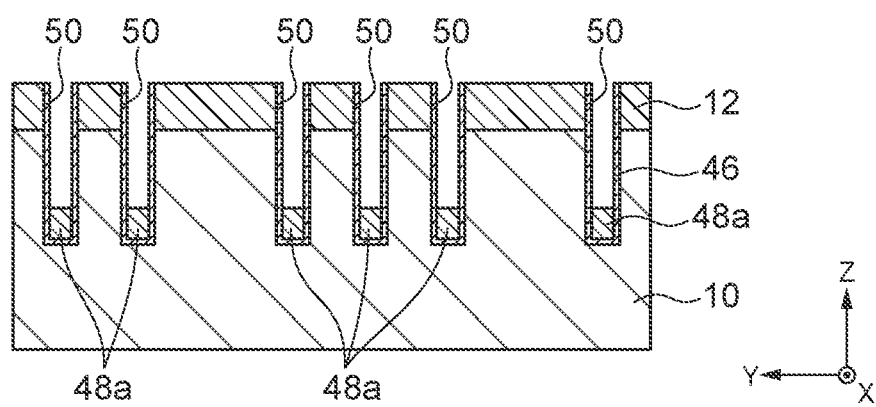
Figure 14D:
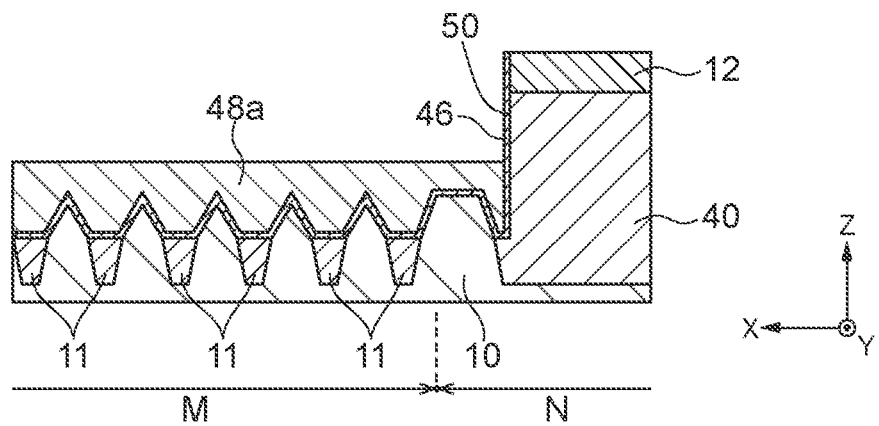
Figure 14E:
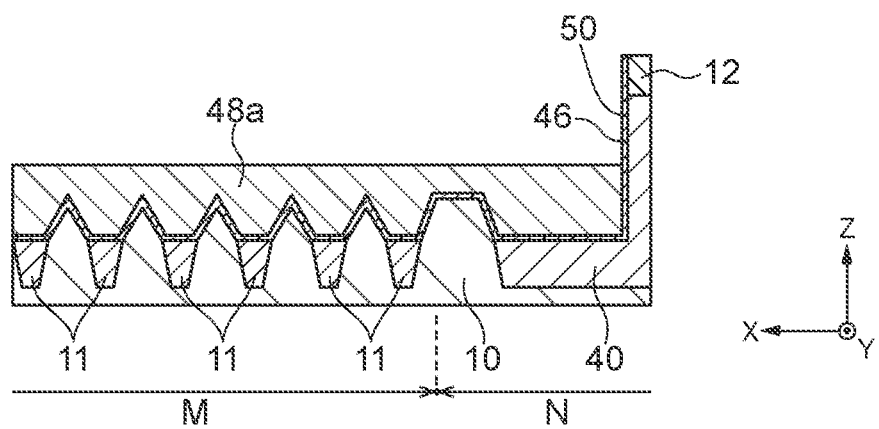
Figure 14F:
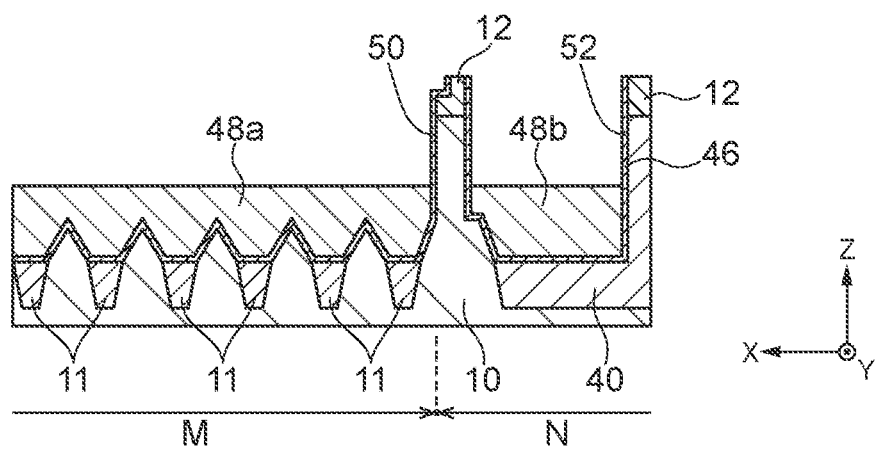
Figure 15A:
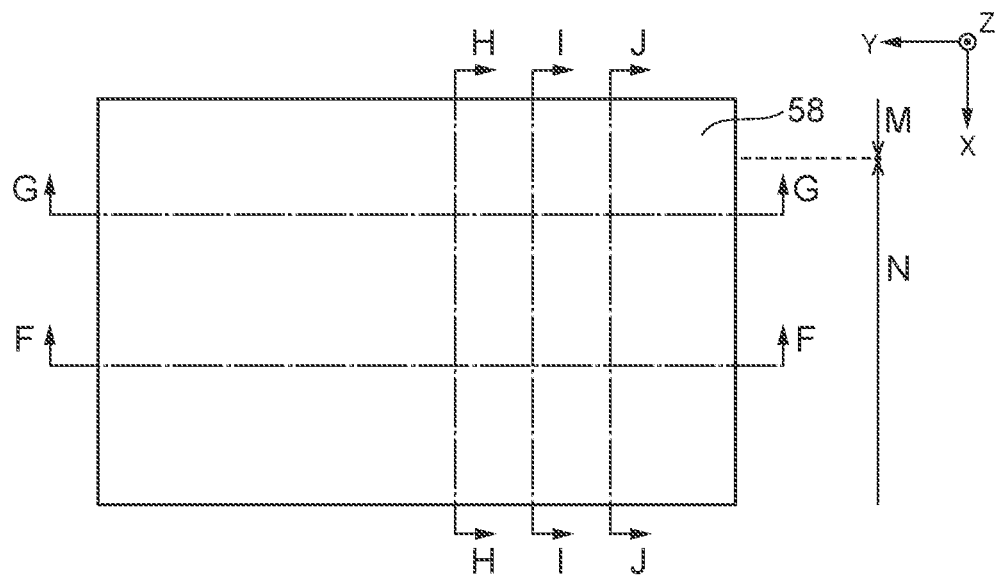
Figure 15B:
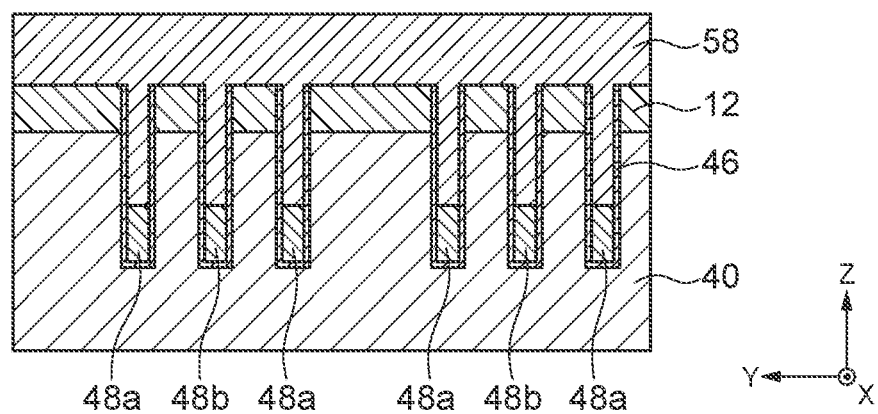
Figure 15C:
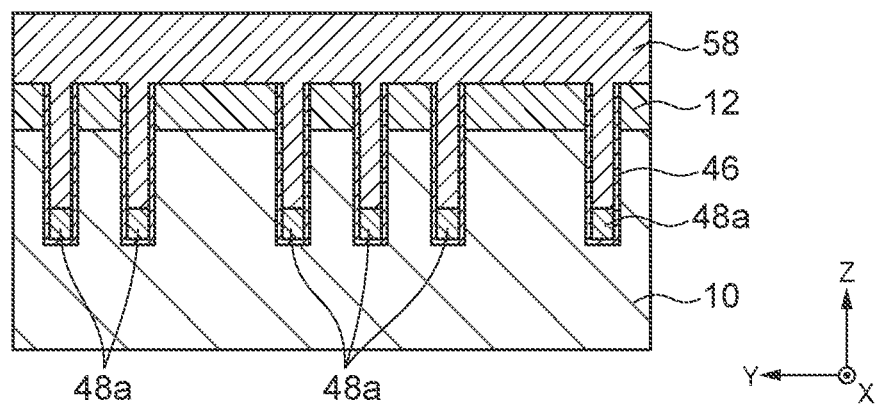
Figure 15D:
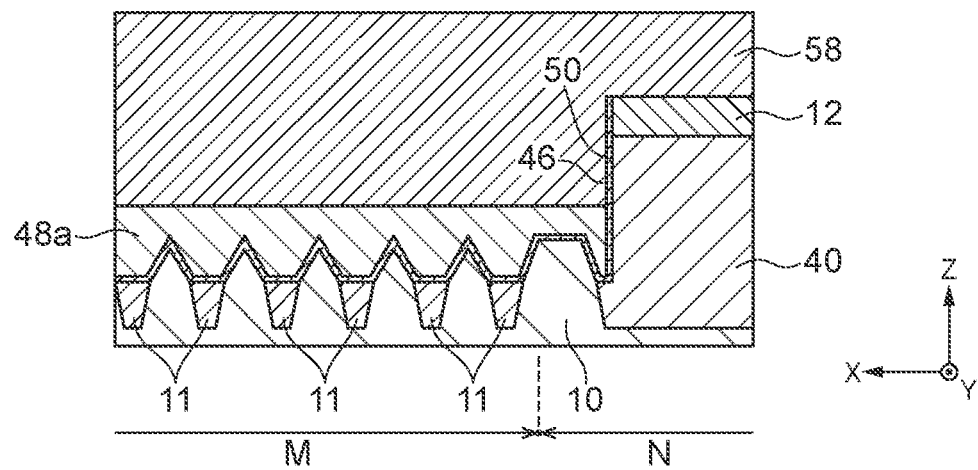
Figure 15E:
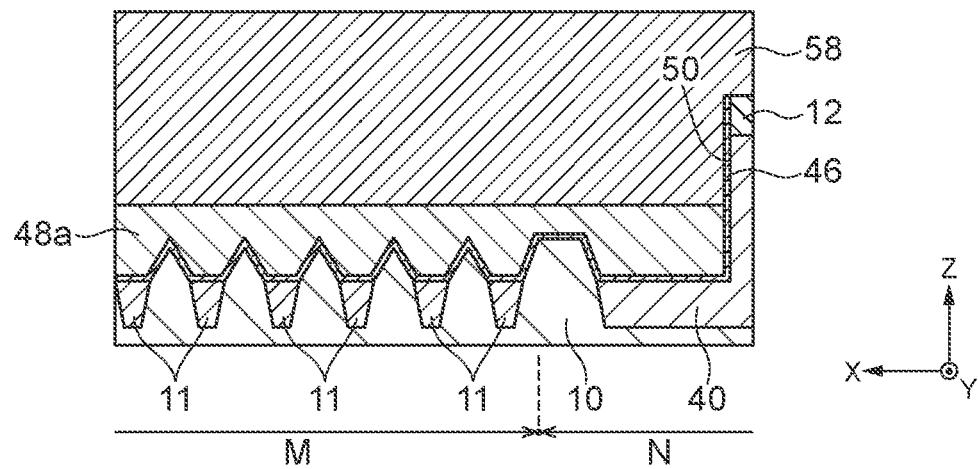
Figure 15F:
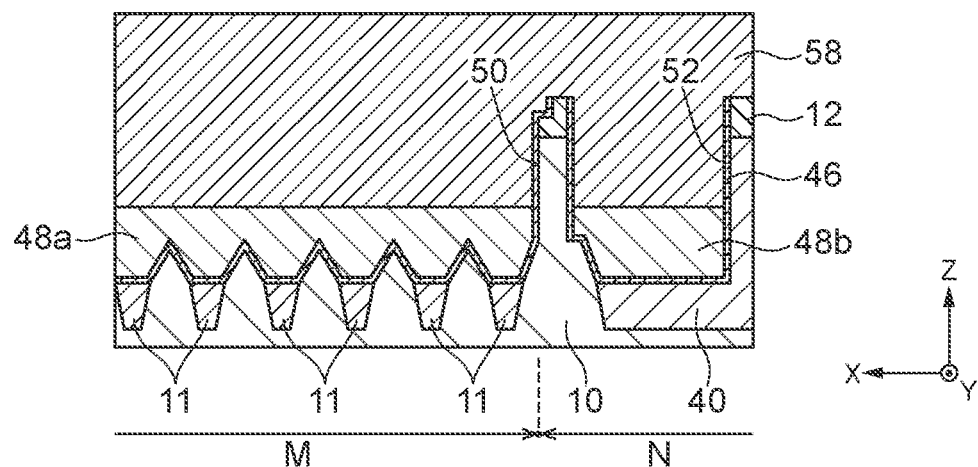
Figure 16A:
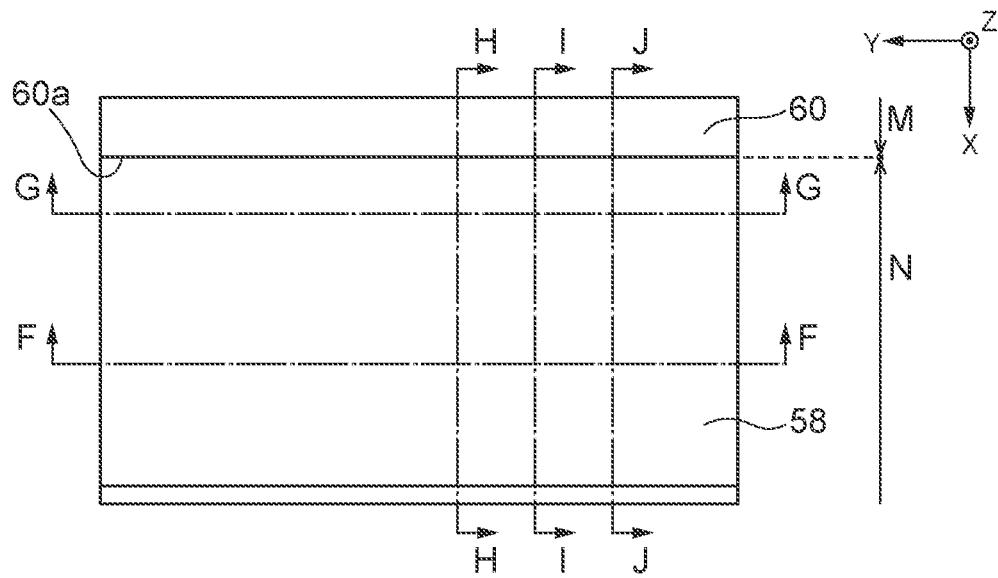
Figure 16B:
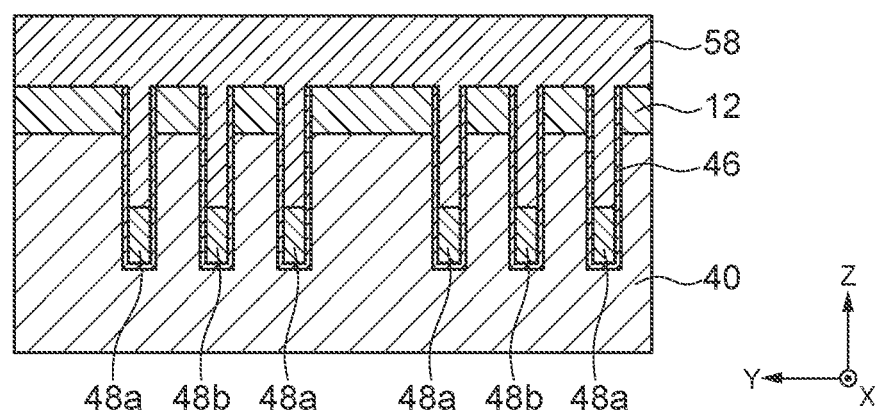
Figure 16C:
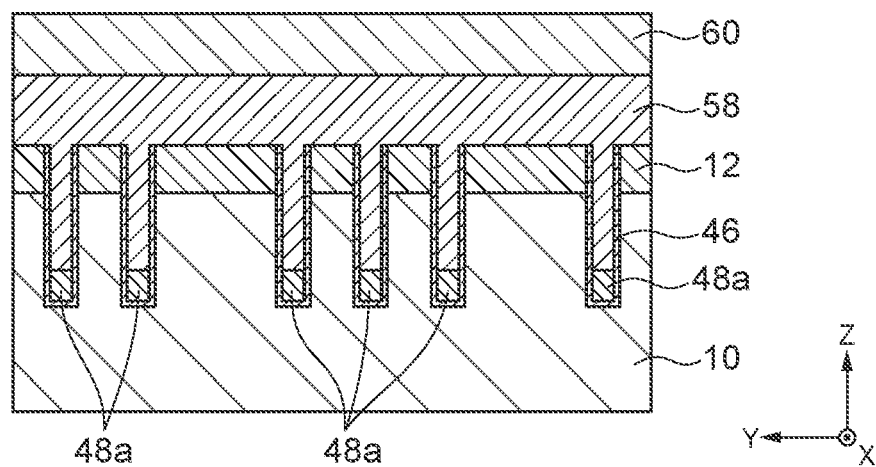
Figure 16D:
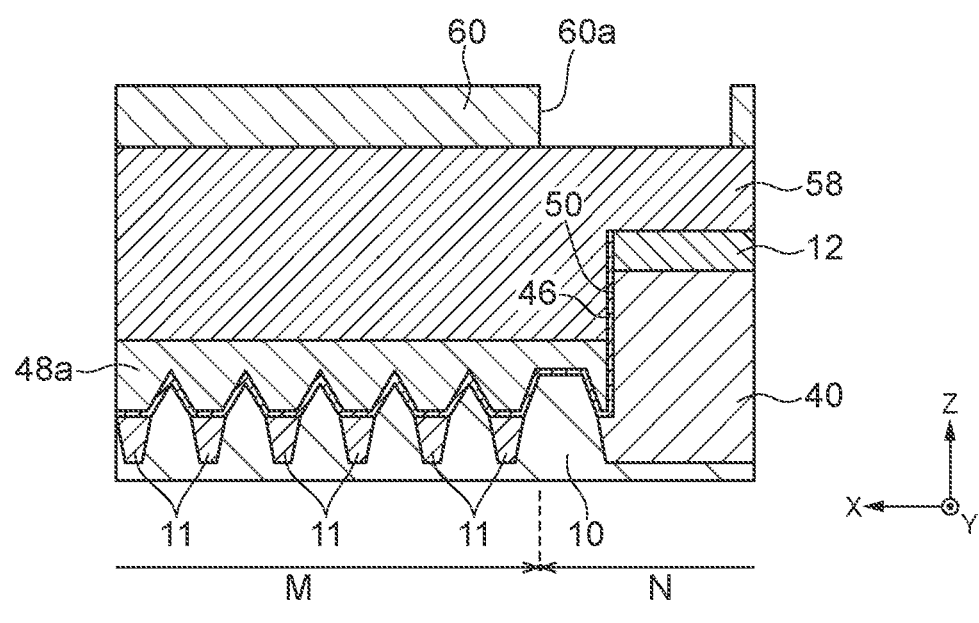
Figure 16E:
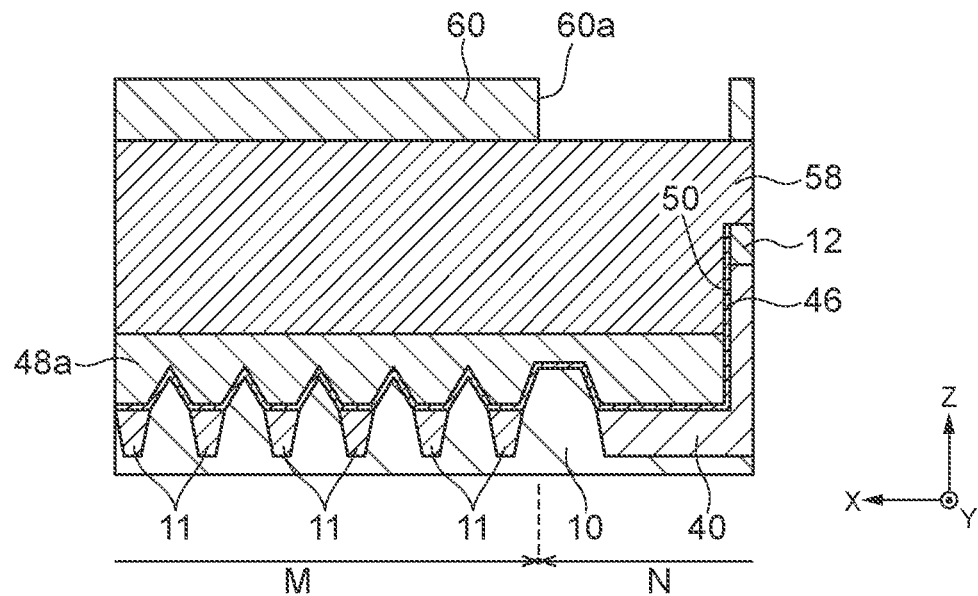
Figure 16F:
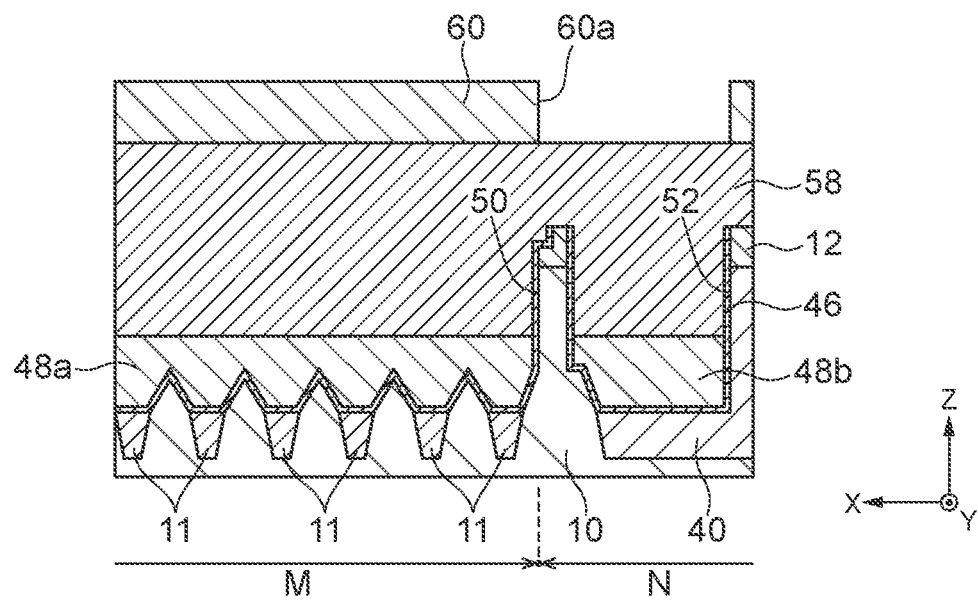
Figure 17A:
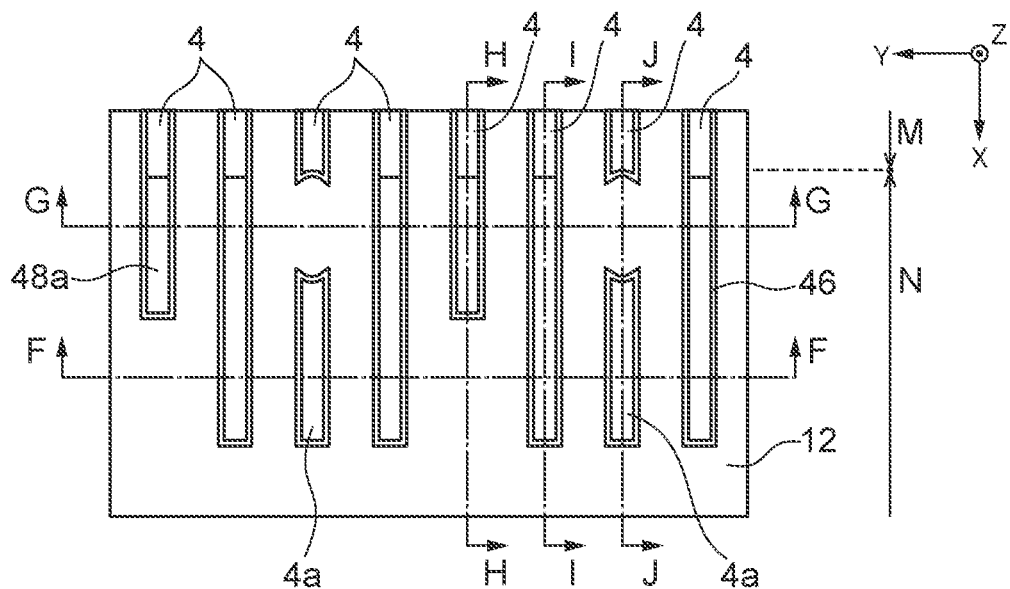
Figure 17B:
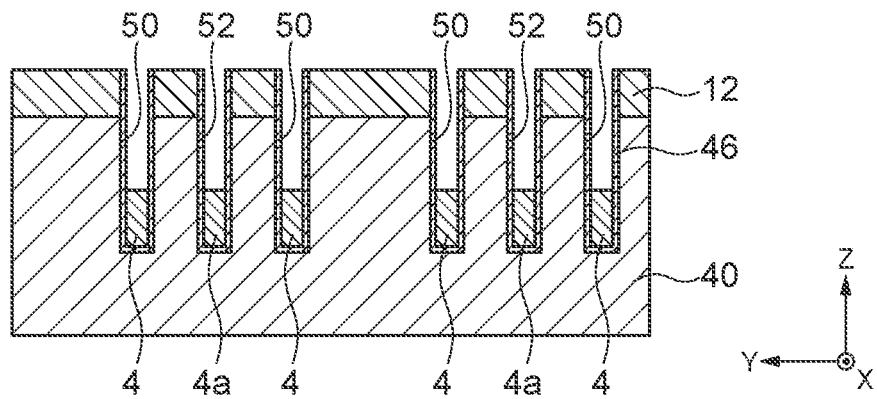
Figure 17C:
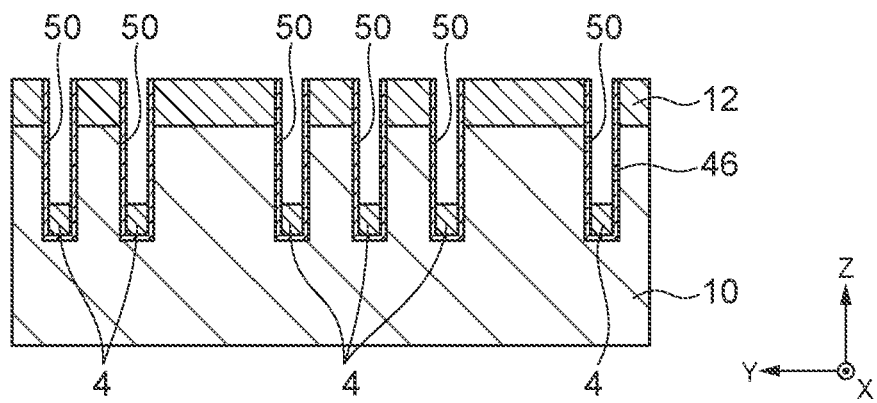
Figure 17D:
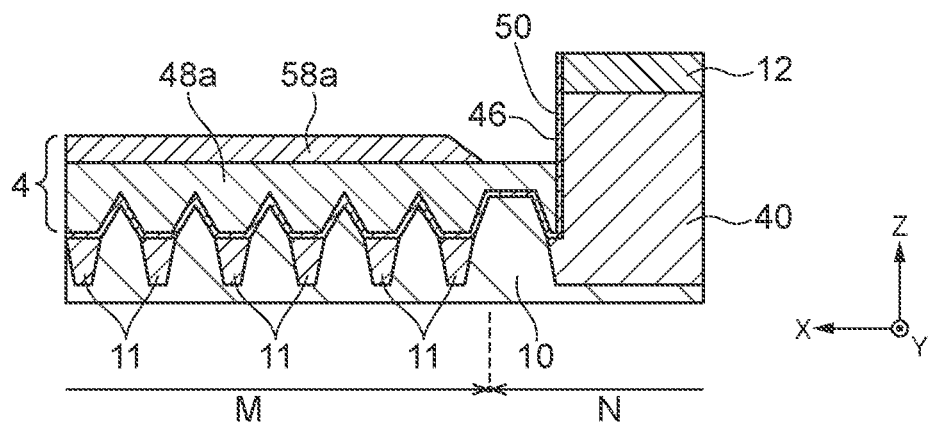
Figure 17E:
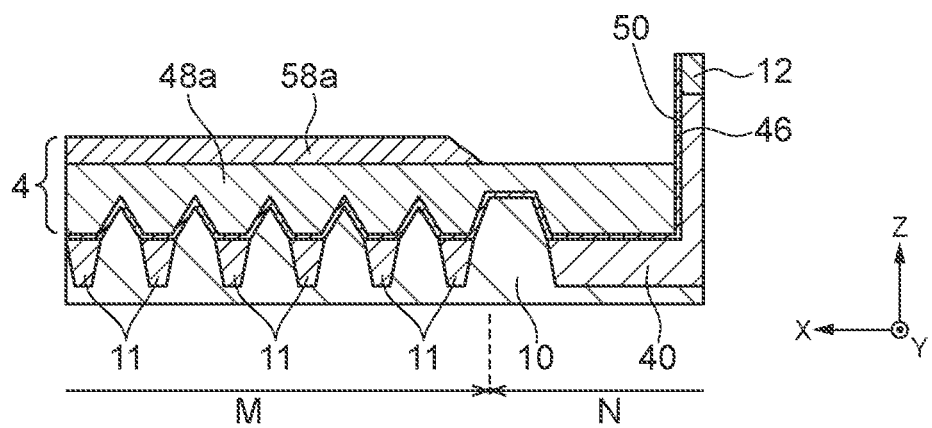
Figure 17F:
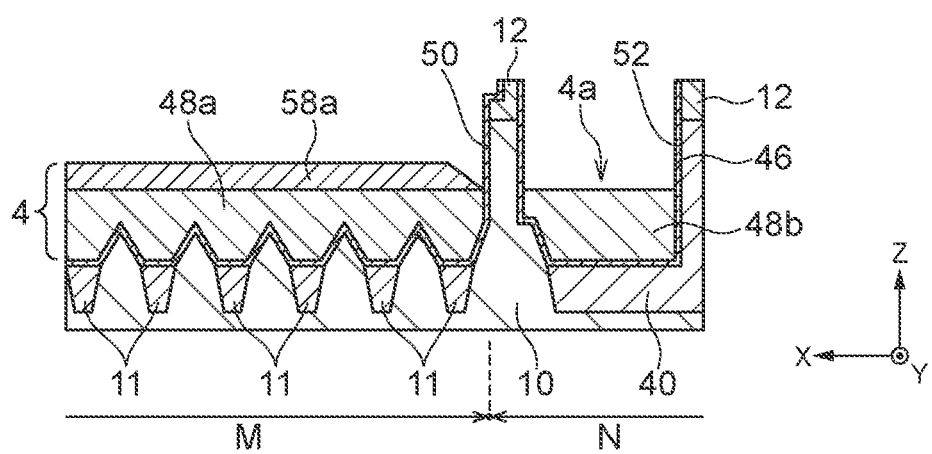
Figure 18A:
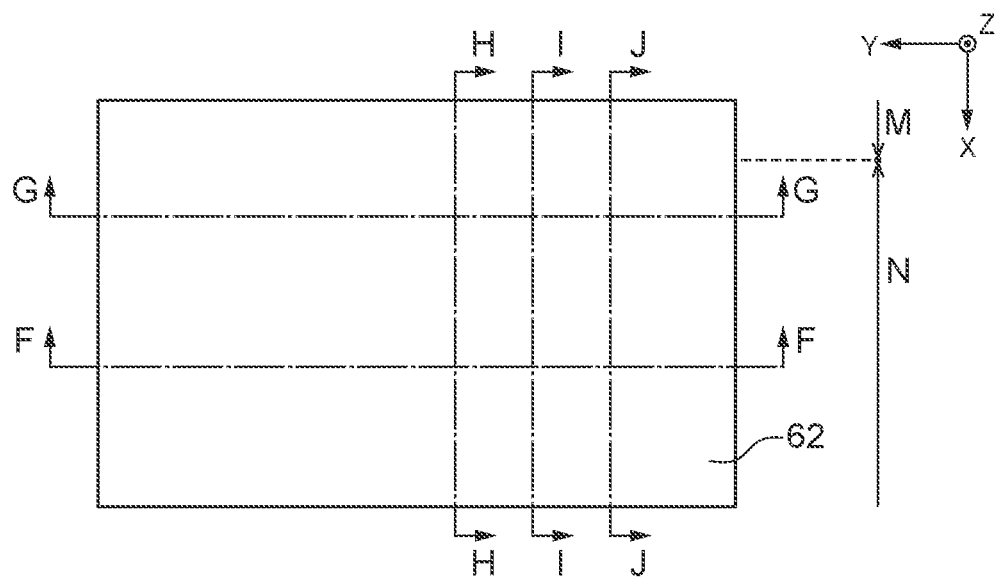
Figure 18B:
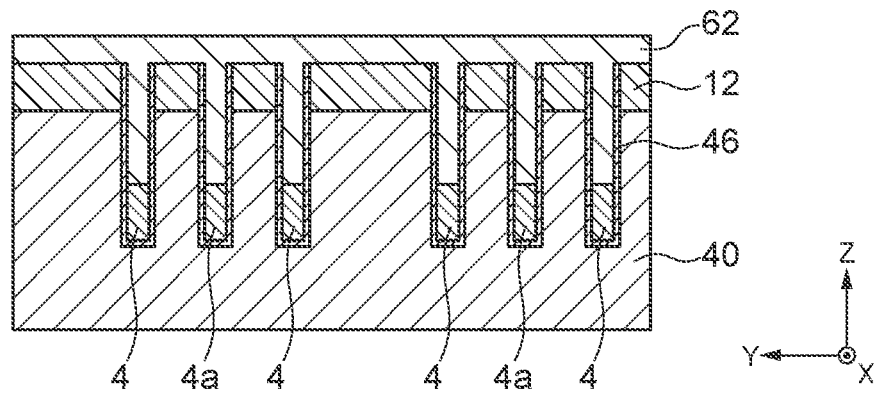
Figure 18C:
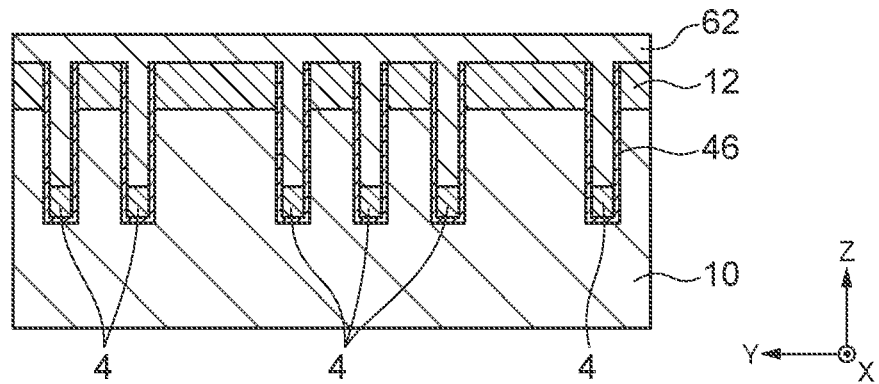
Figure 18D:
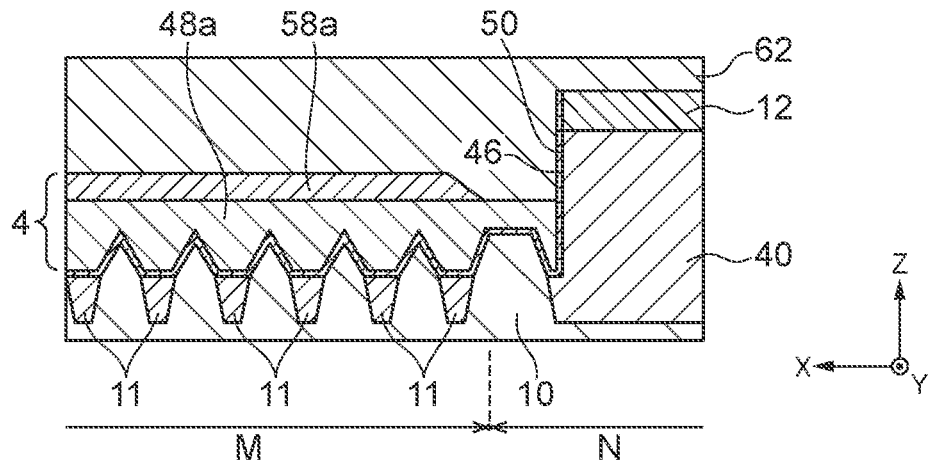
Figure 18E:
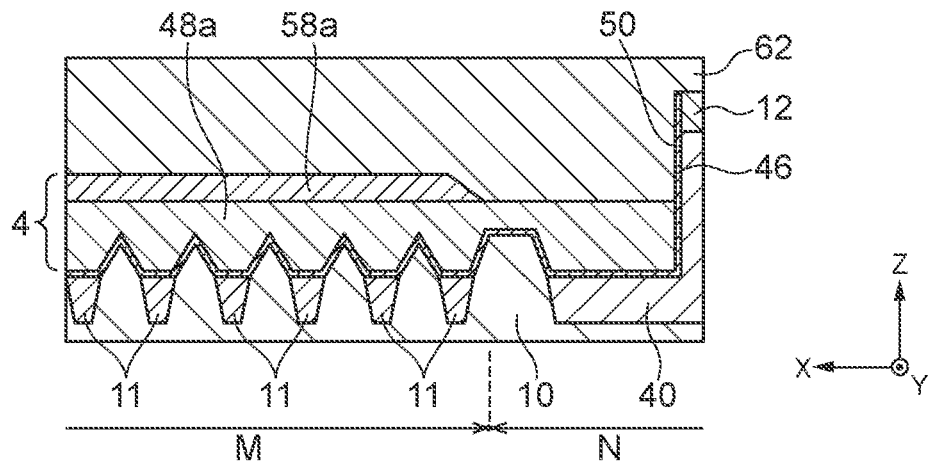
Figure 18F:
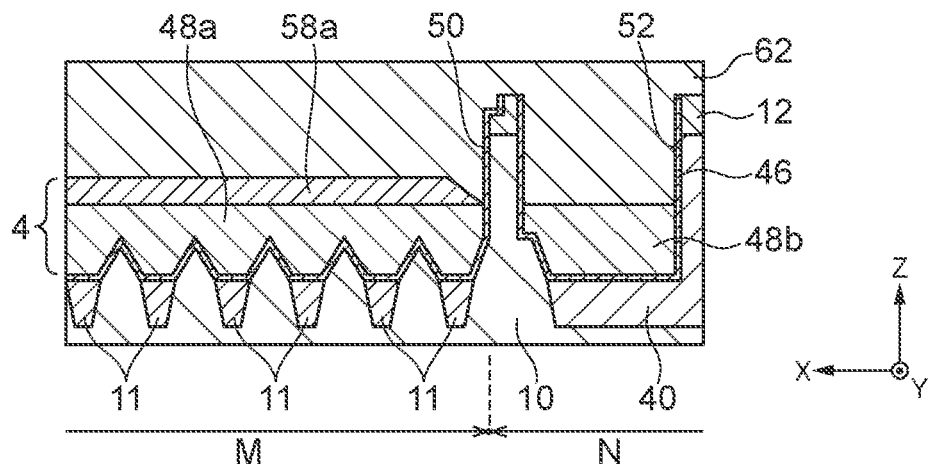
Figure 19A:
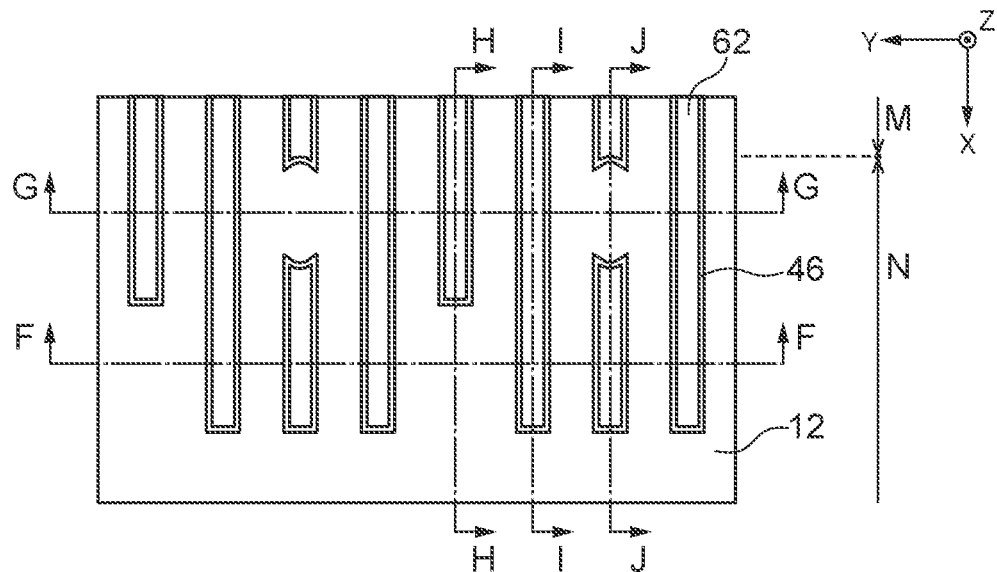
Figure 19B:
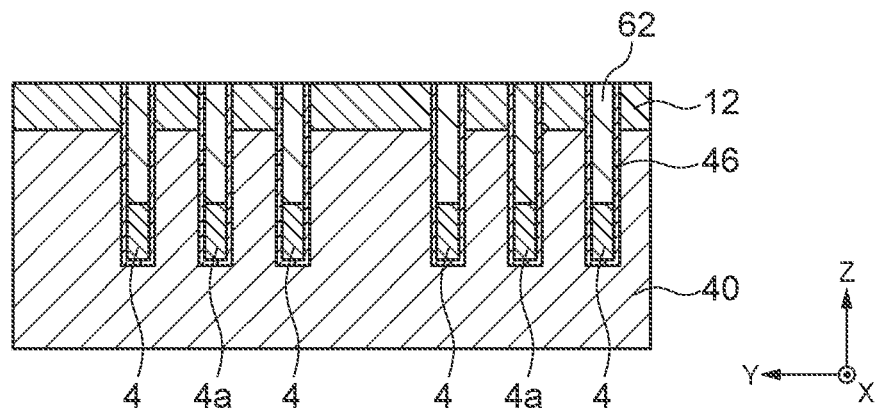
Figure 19C:
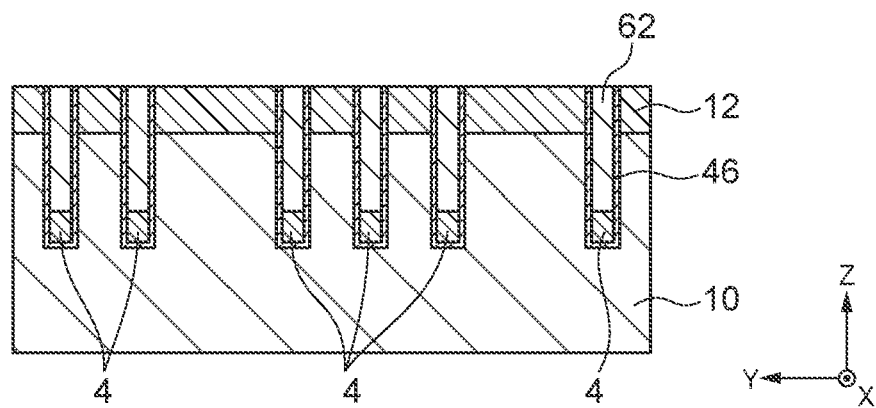
Figure 19D:
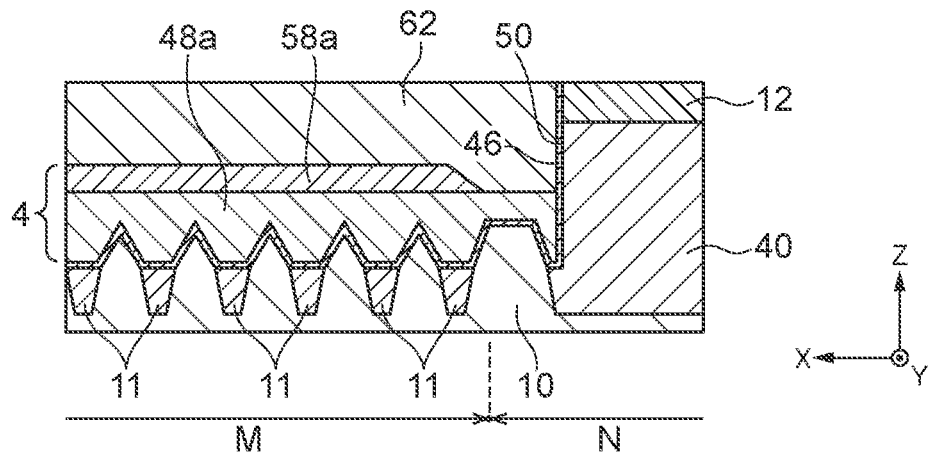
Figure 19E:
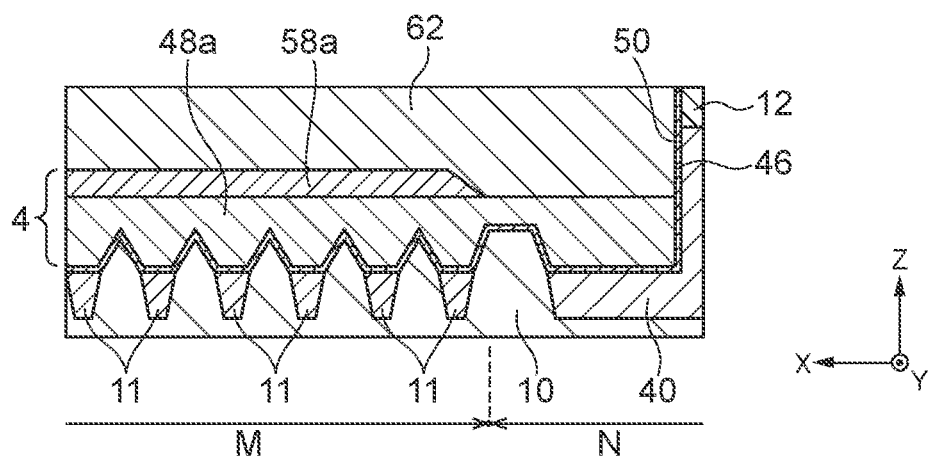
Figure 19F:
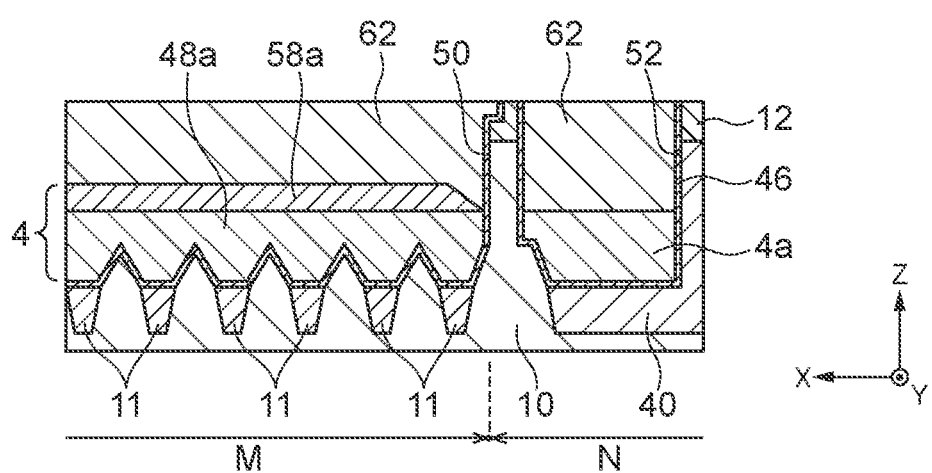

The protruding patterns 441 correspond to the wiring-nonexistent regions 4c in FIG. 2A and FIG. 2B. The isolated patterns 442 correspond to the wiring-cut regions 4b in FIG. 2A and FIG. 2B. Herein, as illustrated in FIG. 11D to FIG. 11F, a peripheral isolation 40 is formed in the peripheral region N.

Subsequently, as illustrated in FIG. 12A to FIG. 12F, with the resist 44 and the transfer patterns 361 used as etching masks, the third sacrifice film 18 is anisotropically dry etched, whereby the patterns in which the resist 44 and the transfer patterns 361 are overlapped are transferred to the third sacrifice film 18. Furthermore, with the patterned third sacrifice film 18 used as an etching mask, the second sacrifice film 16, the first sacrifice film 14, the first insulating film 12, the peripheral isolation 40, and the semiconductor substrate 10 are anisotropically dry etched. Subsequently, the resist 44, the thirteenth sacrifice film 42, the third sacrifice film 18, the second sacrifice film 16, and the first sacrifice film 14 are removed.

By this process, word-line trenches 50 are formed in the semiconductor substrate 10 and the peripheral isolation 40. Portions directly below the protruding patterns 441 and the isolated patterns 442 are not etched. Thus, word-line trenches 50 corresponding to the protruding patterns 441 are not formed, whereby first trench-nonexistent portions 54 are formed. Furthermore, word-line trenches 50 corresponding to the isolated patterns 442 are not formed, whereby second trench-nonexistent portions 56 are formed.

On the extension of each second trench-nonexistent portion 56, an offset trench 52 that is an isolated pattern is formed. Herein, by embedding conductive material in the word-lines trench 50 as described later, word-lines 4 are formed. In locations where the word-line trenches 50 are not formed, word-lines 4 are not formed. The first trench-nonexistent portions 54 correspond to the wiring-nonexistent regions 4c illustrated in FIGS. 2A and 2B. The second trench-nonexistent portions 56 correspond to the wiring-cut regions 4b illustrated in FIGS. 2A and 2B.

Subsequently, as illustrated in FIG. 13A to FIG. 13F, a second insulating film 46 is formed so as to thinly cover inner walls of the word-line trenches 50, inner walls of the offset trenches 52, and side walls and the upper surface of the first insulating film 12. Subsequently, a first conductive film 48 is formed so as to cover the upper surface of the second insulating film 46, fill the word-line trenches 50 and the offset trenches 52, and cover the first insulating film 12. The first conductive film 48 includes conductive material, and the first conductive film 48 contains titanium nitride (TiN), for example. The first conductive film 48 is formed by CVD, for example.

Subsequently, as illustrated in FIG. 14A to FIG. 14F, the first conductive film 48 is etched back by anisotropic dry etching. The first conductive film 48 is etched to the extent that the first conductive film 48 on the upper surface of the first insulating film 12 is removed and further the first conductive film 48 is left remaining in lower portions of the word-line trenches 50 and the offset trenches 52. The first conductive film 48 remaining in the lower portions of the word-line trenches 50 forms residual conductive materials 48a.

The first conductive film 48 remaining in lower portions of the offset trenches 52 forms residual conductive materials 48b. Areas inside the word-line trenches 50 and the offset trenches 52 and above the residual conductive materials 48a and the residual conductive materials 48b are hollows. Subsequently, the second insulating film 46 is anisotropically dry etched, whereby the second insulating film 46 on the upper surface of the first insulating film 12 is removed and the upper surface of the first insulating film 12 is exposed.

Subsequently, as illustrated in FIG. 15A to FIG. 15F, a second conductive film 58 is formed so as to cover the second insulating film 46 in the word-line trenches 50 and the offset trenches 52, fill the word-line trenches 50 and the offset trenches 52, and cover the upper surface of the first insulating film 12. The second conductive film 58 includes conductive material, and contains polysilicon doped with impurities, for example. The impurities contain at least any one of phosphorus (P), arsenic (As), and boron (B), for example. The second conductive film 58 is formed by using CVD, for example. The conductive film is doped with the impurities by introducing source gas for impurities into deposition gas during the CVD, for example.

Subsequently, as illustrated in FIG. 16A to FIG. 16F, a resist 60 that has been patterned is formed on the second conductive film 58. The resist 60 is patterned by a known lithography technique. The resist 60 is formed so as to cover the memory cell array region M, and an opening 60a where the resist 60 does not exist is formed in the peripheral region N.

Subsequently, as illustrated in FIG. 17A to FIG. 17F, with the resist 60 used as an etching mask, the second conductive film 58 is anisotropically dry etched, whereby the second conductive film 58 in the peripheral region N is removed. Subsequently, the second conductive film 58 is dry etched such that the resist 60 is removed and the second conductive film 58 having a predetermined film thickness is left remaining in the memory cell array region M. This dry etching may use either condition of anisotropic and isotropic types. The remaining second conductive film 58 forms a residual conductive material 58a.

By the above-described processes, word-lines 4 having a layered structure of the residual conductive materials 48a and the residual conductive materials 58a are formed in the memory cell array region M. In the peripheral region N, the word-lines 4 have a single-layer structure of the residual conductive materials 48a without the residual conductive materials 58a. The offcuts 4a have a single-layer structure of the residual conductive materials 48b without the residual conductive materials 58a.

Subsequently, as illustrated in FIG. 18A to FIG. 18F, a third insulating film 62 is formed so as to cover areas above the memory cell array region M and the peripheral region N. The third insulating film 62 includes insulating material, and contains silicon nitride, for example. The third insulating film 62 is formed by CVD, for example.

Subsequently, as illustrated in FIG. 19A to FIG. 19F, the third insulating film 62 is etched back by anisotropic dry etching, whereby the film thickness of the third insulating film 62 is reduced until the upper surface of the first insulating film 12 is exposed. By this process, the third insulating film 62 is embedded upon the word-lines 4 in the word-line trenches 50 and upon the offcuts 4a in the offset trenches 52.

Subsequently, as illustrated in FIG. 20A to FIG. 20F, a fourth insulating film 64 is formed so as to cover the third insulating film 62 and the first insulating film 12, and then word-line contacts 8 are formed on alternate word-lines 4. The word-line contacts 8 are arranged in the peripheral region N.

The word-line contacts 8 are formed, for example, as follows. To begin with, in the peripheral region N, known lithography and anisotropic dry etching are performed to form contact holes extending from the upper surface of the fourth insulating film 64 to the upper surface of the residual conductive material 48a. Subsequently, these contact holes are filled with conductive material and the conductive material is further formed on the fourth insulating film 64, then the conductive material is etched back by anisotropic dry etching, thereby the upper surface of the fourth insulating film 64 is exposed. By these processes, the conductive material is embedded in the holes to form the word-line contacts 8.

Figure 20A:
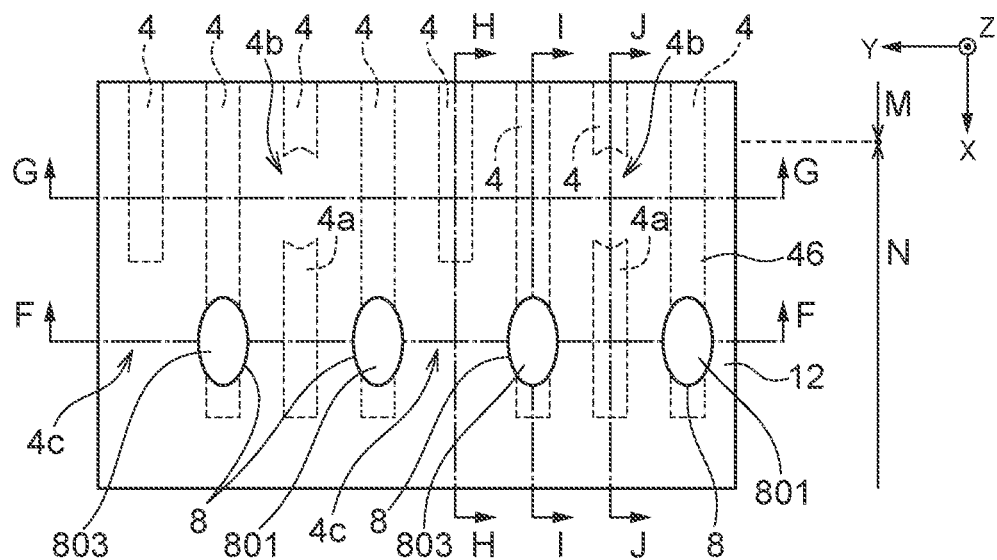
Figure 20B:
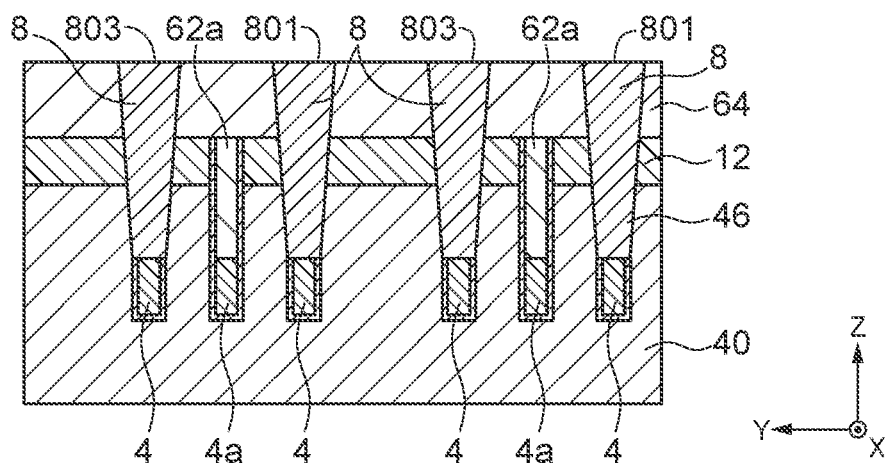
Figure 20C:
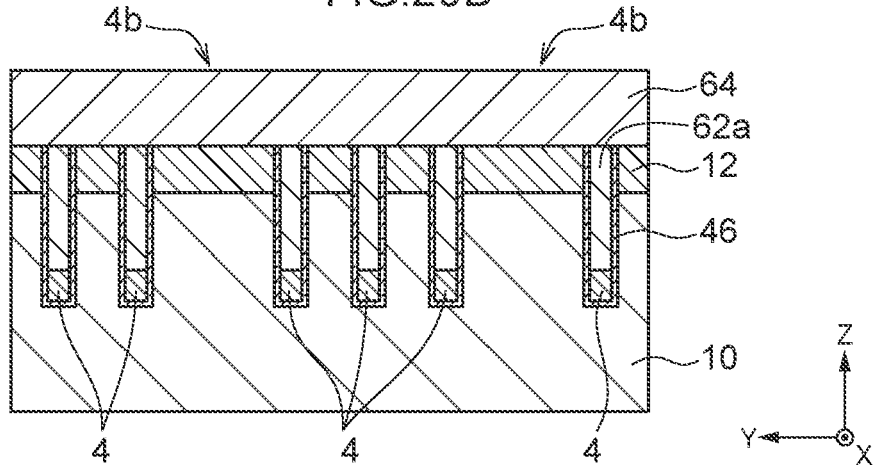
Figure 20D:
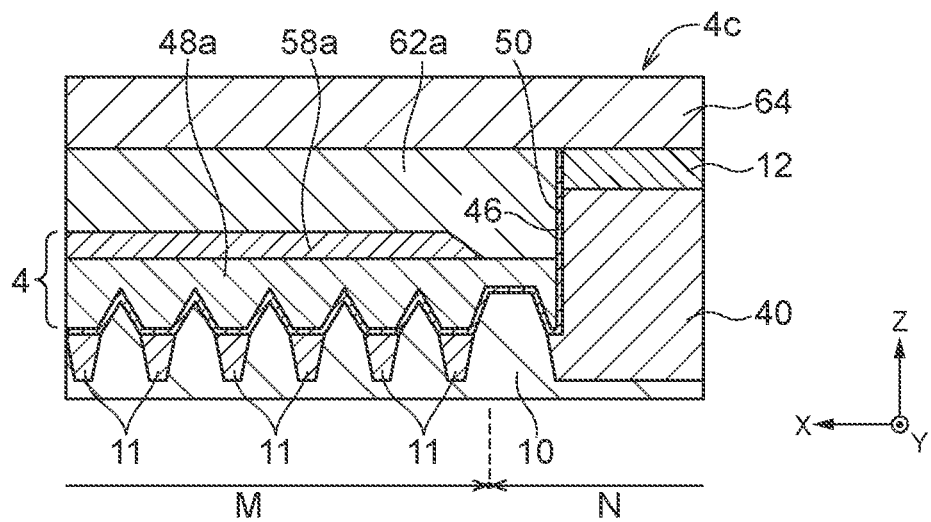
Figure 20E:
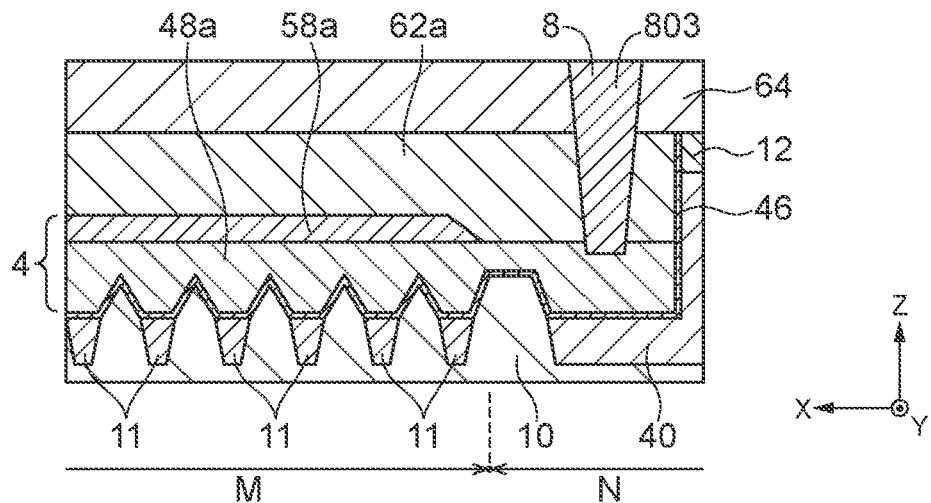
Figure 20F:
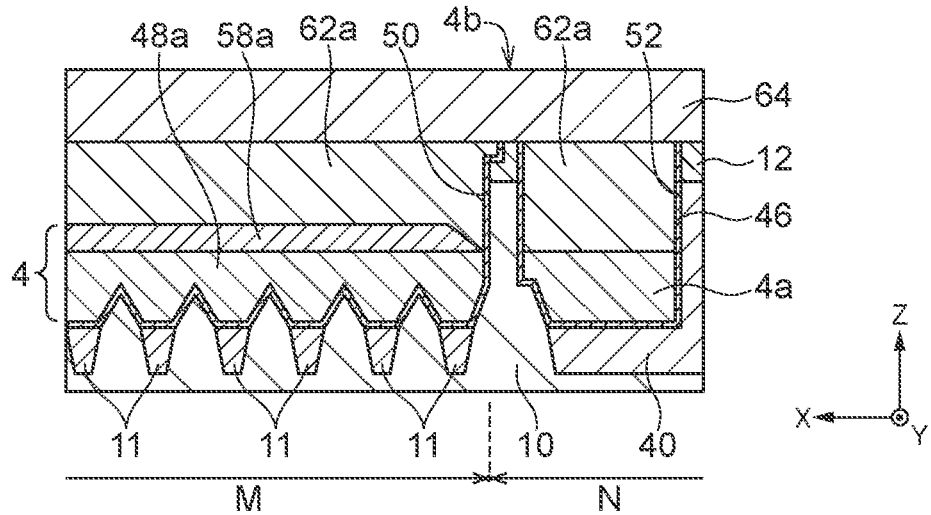

Between each word-line contact 801 and the corresponding word-line contact 803 illustrated in FIG. 20A, an offcut 4a or a wiring-nonexistent region 4c is formed in the same manner as for the word-line contacts 801 and the word-line contacts 803 illustrated in FIG. 2A. Each word-line contact 801 and the corresponding word-line contact 803 are word-line contacts 8 that are alternately arranged. The lithography process of opening the contact holes for the word-line contacts 801 and the lithography process of opening the contact holes for the adjacent word-line contacts 803 may be separate processes.

In the same manner, each word-line contact 802 and the corresponding word-line contact 804 illustrated in FIG. 2B are word-line contacts 8 that are alternately arranged. The lithography process of opening the contact holes for the word-line contacts 802 and the lithography process of opening the contact holes for the adjacent word-line contacts 804 may be separate processes.

The repeating pitch of the word-line contacts 8 is twice the repeating pitch P3 of the word-lines 4 and, in other words, is the repeating pitch P2. Thus, the repeating pitch of the respective alternate contacts of the word-line contacts 801 and the word-line contacts 803 is four times longer than the repeating pitch P3 and, in other words, is the repeating pitch P1. When the lithography processes for the word-line contacts 801 and for the word-line contact 803 are separate processes, adjustment can be made such that the resolution limit of an exposure device is not exceeded in each lithography process. Similarly, when the lithography processes for the word-line contacts 802 and for the word-line contacts 804 are separate processes, adjustment can be made such that the resolution limit of an exposure device is not exceeded in each lithography process.

As described above, even if adjacent word-line contacts 8 are so close to each other that the distance therebetween exceeds the resolution limit of the exposure device, problems such as failed patterning can be avoided when the adjacent word-line contacts 8 are formed by separate lithography processes. Thus, the contact holes for the word-line contacts 8 can be more reliably opened, and consequently production yields of the semiconductor memory device 1 can be increased.

Although the semiconductor memory device 1 according to the embodiment exemplified by a DRAM has been described above, this is merely one example, and it is not intended to be limited to the DRAM. The semiconductor memory device 1 can be applied to memory devices other than the DRAM, for example, to memory devices such as a static random access memory (SRAM), a flash memory, an erasable programmable read-only memory (EPROM), a magnetoresistive random access memory (MRAM), and a phase-change memory.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosed embodiment. Thus, it is intended that the scope of at least some of the present disclosure herein disclosed should not be limited by the particular disclosed embodiments described above.

The invention claimed is:

1. An apparatus, comprising:
a substrate;
a memory cell region provided over the substrate;
a first peripheral region provided over the substrate and adjacent to the memory cell region;
a second peripheral region provided over the substrate, the memory cell region arranged between the first peripheral region and the second peripheral region; and
first, second, third, fourth and fifth word-lines each extending in parallel across the memory cell region and the first peripheral region in numerical order;
first, third and fifth contacts on edge portions of the first, third and fifth word-lines, respectively, in the first peripheral region; and
second and fourth contacts on edge portions of the second and fourth word-lines, respectively, in the second peripheral region,
wherein, in the first peripheral region, an offcut of the second word-line is interposed between the edge portion of the first word-line where the first contact overlaps and the edge portion of the third word-line where the third contact overlaps,
wherein, in the first peripheral region, no offcut of the fourth word-line is interposed in a wiring-nonexistent region between the edge portion of the third word-line where the third contact overlaps and the edge portion of the fifth word line where the fifth contact overlaps.

2. The apparatus of claim 1, wherein the first, third and fifth contacts are connected to the edge portions of the first, third and fifth word-lines, respectively, in the first peripheral region.

3. The apparatus of claim 1, wherein, the second and fourth contacts are connected to the edge portions of the second and fourth word-lines in the second peripheral region, respectively.

4. The apparatus of claim 1, wherein the offcut of the second word-line in the first peripheral region is electrically floating.

5. The apparatus of claim 1, wherein the memory cell region includes a plurality of memory cells.

6. The apparatus of claim 5, wherein the first, second, third, fourth and fifth word-lines are coupled to corresponding ones of the plurality of memory cells to control accesses to the corresponding ones of the plurality of memory cells.

7. The apparatus of claim 1, wherein each of the first, second, third, fourth and fifth word-lines includes conductive material embedded in a trench of the substrate.

8. The apparatus of claim 1, wherein an offcut of the third word-line is interposed between the edge portions of the second and fourth word-lines in the second peripheral region.

9. The apparatus of claim 8, wherein the offcut of the third word-line in the second peripheral region is electrically floating.

10. The apparatus of claim 8, wherein the offcut of the second word-line in the first peripheral region and the offout of the third word-line in the second peripheral region are electrically floating.

11. The apparatus of claim 8, wherein, in the second peripheral region, the offcut of the third word-line is on one side of the edge portion of the second word-line, and no offcut of the first word-line is on another side of the edge portion of the second word-line.

12. The apparatus of claim 8, wherein, in the second peripheral region, the offcut of the third word-line is on one side of the edge portion of the fourth word-line, and no offcut of the fifth word-line is on another side of the edge portion of the fourth word-line.

13. An apparatus, comprising:
a substrate;
a memory cell region provided over the substrate;
a first peripheral region provided over the substrate, the first peripheral region provided adjacent to one side of the memory cell region;
a second peripheral region provided over the substrate, the second peripheral region provided adjacent to another side of the memory cell region; and
a plurality of word-lines arranged by repeating a group including first, second, third and fourth word-lines in numerical order, each of the plurality of word-lines extending across the memory cell region and the first and second peripheral regions, the group including a first group and a second group, wherein the first group and second group each includes the first, second, third and fourth word lines; and
first and third contacts on edge portions of the first and third word-lines in the first peripheral region, respectively, and second and fourth contacts on edge portions of the second and fourth word-lines in the second peripheral region, respectively,
wherein the first and the third word-lines are provided adjacently between the second and fourth word-lines,
wherein, in the first peripheral region, an offcut of the fourth word-line of the first group is interposed between the edge portion of the third word-line of the first group where the third contact overlaps and the edge portion of the first word-line of the second group where the first contact overlaps, and
wherein, in the first peripheral region, no offcut of the second word-line of the first group is interposed in a wiring-nonexistent region between the edge portion of the third word-line of the first group where the third contact overlaps and the edge portion of the first word line of the first group where the first contact overlaps.

14. The apparatus of claim 13, wherein the first and third contacts are connected to the edge portions of the first and third word-lines in the first peripheral region, respectively, and the second and fourth contacts are connected to the edge portions of the second and fourth word-lines in the second peripheral region, respectively.

15. The apparatus of claim 13, wherein
the memory cell region includes a plurality of memory cells, and
the first, second, third and fourth word-lines are coupled to corresponding ones of the plurality of memory cells to control accesses to the corresponding ones of the plurality of memory cells, respectively.

16. The apparatus of claim 13, wherein each of the first, second, third and fourth word-lines is embedded in a trench provided on the substrate.

17. The apparatus of claim 13, wherein
a first length of the first and the third word-lines in the first peripheral region is longer than a second length of the second word-line in the first peripheral region, and
the second length of the second word-line in the first peripheral region is longer than a third length of the fourth word-line in the first peripheral region.

18. The apparatus of claim 17, wherein
a fourth length of the second and fourth word-lines in the second peripheral region is longer than a fifth length of the first word-line in the second peripheral region, and
the fifth length of the first word-line in the second peripheral region is longer than a sixth length of the third word-line in the second peripheral region.

19. The apparatus of claim 13, wherein, in the second peripheral region, an offcut of the third word-line of the first group is interposed between the edge portions of the second and fourth word-lines of the first group.

20. The apparatus of claim 19, wherein, in the second peripheral region, no offcut of the first word-line of the second group is interposed between the edge portion of the fourth word-line of the first group and the edge portion of the second word-line of the second group.

* * * * *

UNITED STATES PATENT AND TRADEMARK OFFICE
CERTIFICATE OF CORRECTION

PATENT NO. : 12,464,710 B2  
APPLICATION NO. : 17/486611  
DATED : November 4, 2025  
INVENTOR(S) : Sasaki et al.

It is certified that error appears in the above-identified patent and that said Letters Patent is hereby corrected as shown below:

In the Claims

| | Claim | Reads | Should Read |
|---|---|---|---|
| Column 14, Line 12 | 10 | "and the offout of the third word-line in the second peripheral" | -- and the offcut of the third word-line in the second peripheral -- |
| Column 14, Line 56 | 13 | "wherein, in the first peripheral region, no offeut of the second word-line" | -- wherein, in the first peripheral region, no offcut of the second word-line -- |

Signed and Sealed this  
Twenty-seventh Day of January, 2026

John A. Squires  
*Director of the United States Patent and Trademark Office*